(12) United States Patent
Kinlen

(10) Patent No.: US 12,371,575 B2
(45) Date of Patent: Jul. 29, 2025

(54) COMPOSITIONS AND METHODS THEREOF

(71) Applicant: THE BOEING COMPANY, Arlington, VA (US)

(72) Inventor: Patrick J. Kinlen, Fenton, MO (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 18/737,608

(22) Filed: Jun. 7, 2024

(65) Prior Publication Data

US 2024/0336785 A1    Oct. 10, 2024

Related U.S. Application Data

(62) Division of application No. 17/480,474, filed on Sep. 21, 2021, now Pat. No. 12,043,762.

(60) Provisional application No. 63/128,633, filed on Dec. 21, 2020.

(51) Int. Cl.
| | |
|---|---|
| H05K 1/03 | (2006.01) |
| C08L 83/04 | (2006.01) |
| C09D 5/24 | (2006.01) |
| C09D 7/20 | (2018.01) |
| C09D 179/02 | (2006.01) |
| C09D 183/04 | (2006.01) |

(52) U.S. Cl.
CPC ............. *C09D 5/24* (2013.01); *C09D 7/20* (2018.01); *C09D 179/02* (2013.01); *C09D 183/04* (2013.01); *H05K 1/0353* (2013.01)

(58) Field of Classification Search
CPC .......... H05K 1/0353; C09D 5/24; C09D 7/20; C09D 179/02; C09D 183/04
See application file for complete search history.

(56) References Cited

U.S. PATENT DOCUMENTS

| | | |
|---|---|---|
| 5,008,041 A | 4/1991 | Cameron et al. |
| 5,624,605 A | 4/1997 | Cao et al. |
| 2008/0114151 A1* | 5/2008 | Shirasawa ............ H10K 85/341 546/10 |

(Continued)

FOREIGN PATENT DOCUMENTS

EP    1178712 B1    6/2010

OTHER PUBLICATIONS

Lindfors et al., "Polyaniline Nanoparticle-Based Solid-Contact Silicone Rubber Ion-Selective Electrodes for Ultratrace Measurements," Analytical Chemistry, vol. 82, No. 22, Nov. 15, 2010, pp. 9425-9432.

(Continued)

*Primary Examiner* — Timothy J Thompson
*Assistant Examiner* — Amol H Patel
(74) *Attorney, Agent, or Firm* — Walters & Wasylyna LLC

(57) ABSTRACT

Aspects of the present disclosure include compositions and methods of making and use thereof. In at least one aspect, a composition, includes a polyaniline and a polysiloxane having a density of about 1.05 g/cm³ or greater. The composition optionally includes a solvent. In at least one aspect, a method includes introducing a polyaniline with a polysiloxane having a density of about 1.05 g/cm³ or greater to form a composition. In at least one aspect, a method includes disposing a composition onto a substrate. The composition includes a polyaniline and a polysiloxane having a density of about 1.05 g/cm³ or greater.

20 Claims, 6 Drawing Sheets

(56) References Cited

U.S. PATENT DOCUMENTS

2020/0006684 A1* 1/2020 Liu .................. H10K 59/122
2020/0037451 A1* 1/2020 Elimelech ............. H05K 1/095

OTHER PUBLICATIONS

European Patent Office, Extended European Search Report for Application 21215719.2-1107 dated May 25, 2022.
Dvornic "High Temperature Stability of Polysiloxanes" Silicon Compounds: Silanes and Silicones 4000A, Ed. B Arkles, G. Larsen, Gelsest Inc. (Year: 2008).
Kulkarni et al. "Thermal stability of polyaniline" Synthetic Metals vol. 30, Issue 3, 1989, pp. 321-325. (Year: 1989).
Depa et al. "Preparation of conducting polysiloxane/polyaniline composites" Journal of Applied Polymer Science vol. 132, Issue 35 (Year: 2015).
Wacker "High-Performance Silicones for Transmission and Distribution" available online as early as Dec. 4, 2020 (Year: 2020).

* cited by examiner

COMPOSITIONS AND METHODS THEREOF

CROSS-REFERENCE TO RELATED APPLICATIONS

This application is a Divisional of U.S. patent application Ser. No. 17/480,474, file Sep. 21, 2021 which claims benefit of and priority to U.S. Provisional Application No. 63/128,633, filed Dec. 21, 2020, of which is hereby expressly incorporated by reference herein in its entirety.

FIELD

Aspects of the present disclosure include compositions and methods of making and use thereof.

BACKGROUND

A surface of a vehicle, such as an aircraft, in motion builds static charge. For example, an aircraft has components located behind the nose of the aircraft. The nose may build a form of static electricity known as precipitation static (P-static).

Surface coatings may be applied to aircraft components to protect surfaces of the aircraft components. However, conventional surface coating(s) of vehicle components of an aircraft are typically not highly conductive, having resistivity of hundreds of kOhms to tens of MegaOhms. Accordingly, conventional surface coatings of an aircraft can allow charge buildup on surfaces (and other components) of the aircraft.

In addition to an inability to dissipate charge buildup, conventional coatings would benefit from further improved resistance to high temperature. Conductivity and high temperature properties can be useful for aircraft as well as component(s) of satellites. For example, a circuit board of a satellite should have high conductivity at high temperature for sustained periods of time. Conventional circuit boards for satellites use polyurethane, which does not have ideal thermal stability or conductivity at high temperature. Attempts have been made to provide substantially homogeneous compositions (e.g., polyurethane compositions) having such properties, but such compositions are ultimately not substantially homogeneous (e.g., the compositions form a gel or other precipitate), do not have sufficient conductivity, do not have sufficient thermal stability, or a combination thereof.

What is needed are compositions that are conductive and have robust high temperature properties, as well as methods of making and using the compositions.

SUMMARY

In at least one aspect, a composition, includes a polyaniline and a polysiloxane having a density of about 1.05 g/cm$^3$ or greater. The composition optionally includes a solvent.

In at least one aspect, a method includes introducing a polyaniline with a polysiloxane having a density of about 1.05 g/cm$^3$ or greater to form a composition.

In at least one aspect, a method includes disposing a composition onto a substrate. The composition includes a polyaniline and a polysiloxane having a density of about 1.05 g/cm$^3$ or greater.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only typical aspects of this present disclosure and are therefore not to be considered limiting of its scope, for the present disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Figure 1:
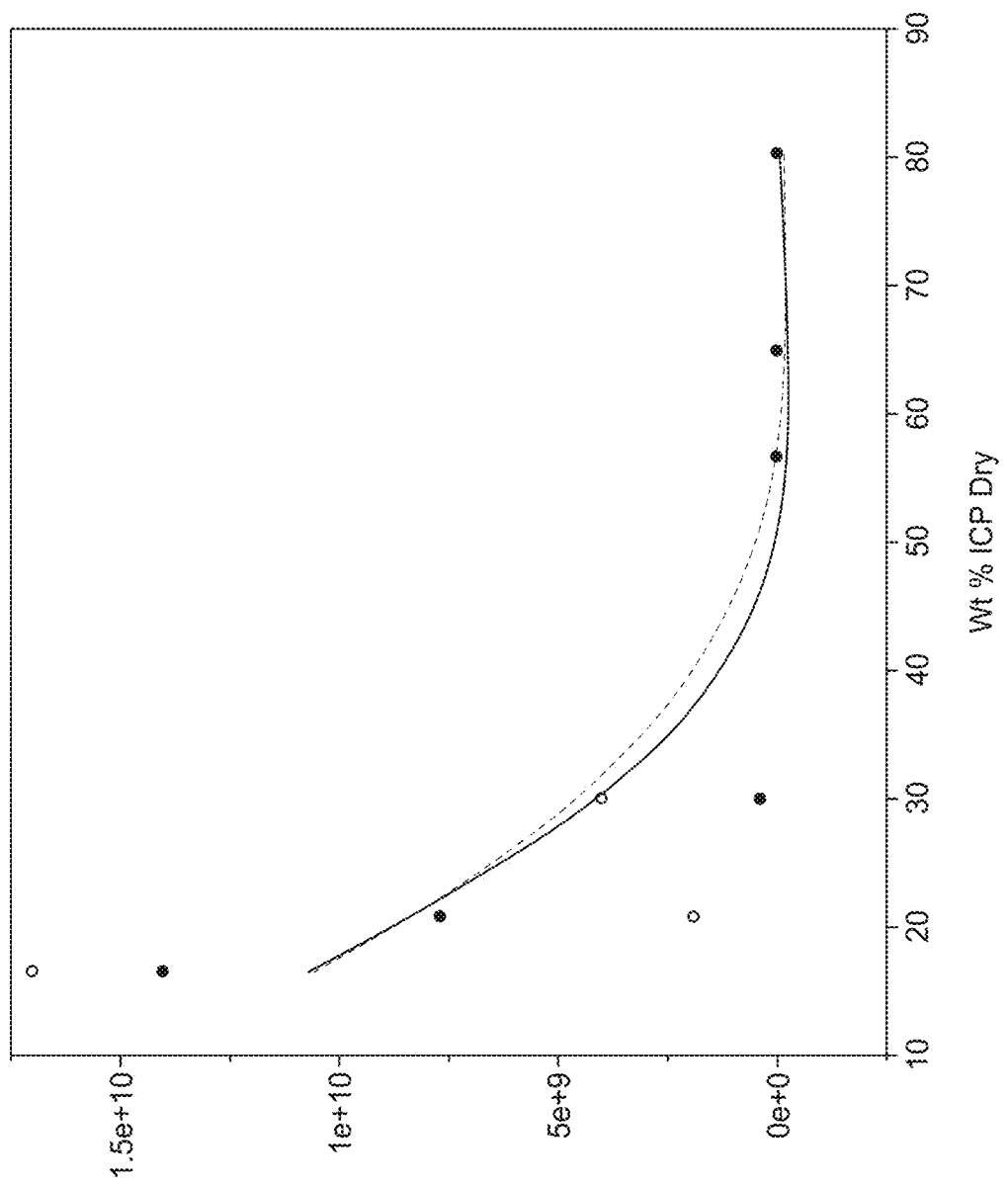
FIG. 1 is a graph illustrating resistance versus PANI-DNNSA concentration of the compositions (with DOW-SIL™ RTV 3145 as polysiloxane), according to an aspect.

The present disclosure provides compositions and methods of making and use thereof. Compositions of the present disclosure include a polyaniline and a polysiloxane. Compositions of the present disclosure can be conductive and have robust high temperature properties. For example, a polysiloxane may provide improved thermal stability, and methods for forming compositions of the present disclosure can provide a substantially homogeneous composition which can provide conductivity and robust thermal stability of a composition. For example, use a solvent compatible with both polysiloxane and polyaniline and stagewise curing of the composition can provide a substantially homogeneous composition. Compositions having polyaniline as a minority component (e.g., 30 wt % or less) can have substantially improved electrical properties (as compared to compositions having polyaniline as a major component). Compositions of the present disclosure can be used for any suitable end use application. For example, a composition can be included as a coating as a conductive sealant or for a circuit board (e.g., of a satellite; dedicated service electronics: cell phones, laptops, microwaves, mining equipment; High-reliability electronics: Aerospace, military, & medical applications; among others. For a circuit board, the circuit board is functional prior to applying the coating. When coated, the coating provides static protection for the electrical components and circuitry. Compositions of the present disclosure can be used as coatings on a vehicle component for deicing applications. Compositions of the present disclosure can be applied to a surface as a single layer/film or as a multilayer stack.

Compositions

Compositions of the present disclosure include polyaniline, polysiloxane, and optionally solvent.

In some aspects, a composition includes a solvent, a polysiloxane, and about 5 wt % to about 30 wt % polyaniline, such as about 8 wt % to about 22 wt %, such as about 8 wt % to about 15 wt %, alternatively about 15 wt % to about 22 wt % polyanline. A composition can include about 5 wt % to about 40 wt % polysiloxane, such as about 5 wt % to about 20 wt %, such as about 7 wt % to about 15 wt %, alternatively about 20 wt % to about 40 wt %, such as about 25 wt % to about 35 wt % polysiloxane. A remainder balance of the composition can include the solvent and optionally any other suitable additive. A composition can have a % solids of about 0% to about 50%, such as about 25% to about 35%. A composition including a solvent, a polysiloxane, and a polyaniline can be shipped with adequate shelf life until curing. For example, an aromatic hydrocarbon solvent reduces or eliminates excess precipitation from the composition during shipping and storage. In contrast, a conventional polyurethane, for example, must be shipped in two separate containers as a part A (isocyanate) and a part B (polyol). Part A and part B are mixed by the end user to form the polyurethane.

Compositions of the present disclosure can include one or more solvents. The solvent can be an aromatic hydrocarbon solvent. Aromatic hydrocarbons promote dissolution of the polysiloxane and the polyaniline to promote excellent consistency of the composition which promotes electrical properties. The solvent can be a xylene, a benzene, a toluene, or combination(s) thereof. In some aspects, a solvent is an aliphatic hydrocarbon solvent. The solvent can be cyclopentane, cyclohexane, cycloheptane, or combination(s) thereof.

In some aspects, a composition can be cured to include less solvent than a pre-cured composition. In some aspects, a composition includes an optional solvent, a polysiloxane, and about 5 wt % to about 90 wt % polyaniline, such as about 5 wt % to about 60 wt %, such as about 5 wt % to about 30 wt %, such as about 5 wt % to about 20 wt %, such as about 5 wt % to about 10 wt %, alternatively about 35 wt % to about 70 wt % polyanline. A composition can include about 95 wt % to about 10 wt % polysiloxane, such as about 85 wt % to about 50 wt %, such as about 80 wt % to about 60 wt %, alternatively about 95 wt % to about 70 wt %, such as about 95 wt % to about 80 wt % polysiloxane, such as about 95 wt % to about 90 wt %. A remainder balance of the composition can include residual solvent and optionally any other suitable additive.

In at least one aspect, a substrate, such as a vehicle component, includes one or more compositions of the present disclosure disposed on the component. Compositions disposed on a substrate (e.g., as a layer) can be applied about 0.1 µm and about 100 µm in thickness, such as about 1 µm to about 8 µm, such as about 2 µm to about 6 µm. In some aspects, a composition (after curing) can have a resistivity of about 4 E+5 Ohms per square (Ω/☐) to about 2.5 E+11Ω/☐, such as about 3 E+8Ω/☐ to about 2.5 E+11Ω/☐, alternatively about 4 E+5Ω/☐ to about to about 3 E+8Ω/☐. Conductivity provides electrostatic dissipation.

A vehicle comprises any suitable transportation device. Vehicles include, but are not limited to, aircraft, automobiles, boats, motorcycles, satellites, etc., and therefore further include manned and unmanned aircraft, manned and unmanned spacecraft, manned and unmanned terrestrial vehicles, manned and unmanned non-terrestrial vehicles, and even manned and unmanned surface and sub-surface water-borne marine vehicles, objects, or structures.

A vehicle component may include one or more compositions of the present disclosure disposed on one or more surfaces of the vehicle component. A vehicle component includes, but is not limited to, any component of a vehicle, such as a circuit board or a structural component, such as a panel or joint, of an aircraft, automobile, etc. A vehicle component can include a nose of an aircraft, a fuel tank, a tail cone, a panel, a coated lap joint between two or more panels, a wing-to-fuselage assembly, a structural aircraft composite, a fuselage body-joint, a wing rib-to-skin joint, and/or other internal component.

Polysiloxanes

The polysiloxane compound may be described according to the following chemical structure of Formula 1:

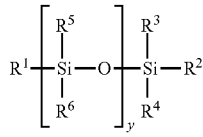

Formula 1

For the above Formula 1, y is a positive integer. $R^1$, $R^2$, $R^3$, and $R^4$ may be each independently selected from $C_{1-10}$alkyl, aryl, $C_{1-10}$alkylaryl, alkenyl, hydrogen, alkyloxy, and $-ON=C(CH_3)_2$. Each $R^5$ and each $R^6$ may be independently selected from $C_{1-10}$alkyl, aryl, $C_{1-10}$alkylaryl, alkenyl, hydrogen, alkyloxy, and $-ON=C(CH_3)_2$. In some aspects, alkyloxy is acetoxy. In some aspects, each $R^5$ and each $R^6$ may be independently selected from $C_{1-10}$alkyl, aryl, $C_{1-10}$alkylaryl, alkenyl, and hydrogen. When y is greater than 1, each $R^5$ and each $R^6$ may be independently selected from $C_{1-10}$alkyl, aryl, and $C_{1-10}$alkylaryl.

In another example, at least one of $R^1$ to $R^4$, or at least one $R^5$ and $R^6$ from at least one of the y groups, is selected from at least one of aryl and $C_{1-10}$alkylaryl. In another example, at least one of $R^1$ and $R^2$ is selected from aryl and $C_{1-10}$alkylaryl. In another example, $R^1$ and $R^2$ are each independently selected from aryl and $C_{1-10}$alkylaryl.

A polysiloxane compound of Formula 1 may be represented by Formula 1a:

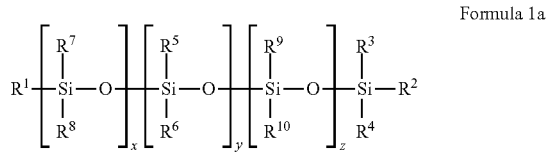

Formula 1a

For the above Formula 1a, each of x, y, and z are independently a positive integer. $R^1$, $R^2$, $R^3$, and $R^4$ may be each independently selected from $C_{1-10}$alkyl, aryl, $C_{1-10}$alkylaryl, alkenyl, hydrogen, alkyloxy, and $-ON=C(CH_3)_2$. Each $R^5$ and $R^6$ may be independently selected from $C_{1-10}$alkyl, aryl, $C_{1-10}$alkylaryl, alkenyl, and hydrogen. Each $R^7$, $R^8$, $R^9$, and $R^{10}$ may be independently selected from $C_{1-10}$alkyl, aryl, $C_{1-10}$alkylaryl, alkenyl, hydrogen, alkyloxy, and $-ON=C(CH_3)_2$. For the above Formula 1a, each $R^1$, $R^2$, $R^3$, $R^4$, $R^5$, $R^6$ $R^7$, $R^8$, $R^9$, and $R^{40}$ may be methyl. In some embodiments, one or more of $R^1$, $R^2$, $R^3$, $R^4$, $R^7$, and $R^8$ is alkenyl, alkyloxy, or $-ON=C(CH_3)_2$.

In some aspects, $R^1$ to $R^{10}$ may each be independently selected from $C_{1-10}$alkyl, aryl, and $C_{1-10}$alkylaryl.

$R^1$ and $R^2$ may be each independently selected from aryl and $C_{1-10}$alkylaryl. $R^1$ and $R^2$ may be independently selected from a $C_{1-10}$alkylaryl. The aryl or $C_{1-10}$alkylaryl may be a mono or bicyclic aryl. The monocyclic aryl may be phenyl or the monocyclic alkylaryl may be a $C_{1-10}$alkylphenyl. The $C_{1-10}$alkylaryl may be a $C_{1-6}$alkylphenyl. The $C_{1-6}$alkylphenyl may be phenethyl.

For Formula 1a, $R^1$ and $R^2$ may be each independently selected from $C_{1-10}$alkyl, aryl and $C_{1-10}$alkylaryl; each $R^3$, $R^4$, $R^5$, $R^7$, $R^8$, $R^9$, and $R^{10}$ may be $C_{1-4}$alkyl; and each $R^6$.

For Formula 1, each $R^3$, $R^4$, and $R^5$ may be selected from $C_{1-10}$alkyl, and each $R^6$ may be independently selected from $C_{1-10}$alkyl, aryl and $C_{1-10}$alkylaryl. Each $R^3$, $R^4$, and $R^5$ may be selected from methyl, and each $R^6$ may be independently selected from methyl, aryl and $C_{1-10}$alkylaryl. $R^1$ and $R^2$ may be each independently selected from aryl and $C_{1-10}$alkylaryl. $R^1$ and $R^2$ may be independently selected from a $C_{1-10}$alkylaryl. The aryl or $C_{1-10}$alkylaryl may be a mono or bicyclic aryl. The monocyclic aryl may be phenyl or the monocyclic alkylaryl may be a $C_{1-10}$alkylphenyl. The $C_{1-10}$alkylaryl may be a $C_{1-6}$alkylphenyl. The $C_{1-6}$alkylphenyl may be phenethyl.

For Formula 1a, each $R^3$, $R^4$, $R^5$, $R^7$, $R^8$, $R^9$, and $R^{10}$ may be independently selected from $C_{1-10}$alkyl, and each $R^6$ may be independently selected from $C_{1-10}$alkyl, aryl, and $C_{1-10}$alkylaryl. Each $R^3$, $R^4$, $R^5$, $R^7$, $R^8$, $R^9$, and $R^{10}$ may be selected from methyl, and each $R^6$ may be independently selected from methyl, aryl and $C_{1-10}$alkylaryl. $R^1$ and $R^2$ may be each independently selected from aryl and $C_{1-10}$alkylaryl. $R^1$ and $R^2$ may be independently selected from a $C_{1-10}$alkylaryl. The aryl or $C_{1-10}$alkylaryl may be a mono or bicyclic aryl. The monocyclic aryl may be phenyl or monocyclic alkylaryl may be a $C_{1-10}$alkylphenyl. The $C_{1-10}$alkylaryl may be a $C_{1-6}$alkylphenyl. The $C_{1-6}$alkylphenyl may be phenethyl.

In another example, at least one of $R^1$ to $R^4$, or at least one $R^5$ and $R^6$ from at least one of the y groups, is selected from at least one of aryl and $C_{1-10}$alkylaryl. In another example, at least one of $R^1$ to $R^4$, or at least one of $R^5$ to $R^{10}$ from at least one of the x, y or z groups, is selected from aryl and $C_{1-10}$alkylaryl. In another example, at least one of $R^1$ and $R^2$ is selected from aryl and $C_{1-10}$alkylaryl. In another example, $R^1$ and $R^2$ are each independently selected from aryl and $C_{1-10}$alkylaryl. In another example, at least one of $R^1$ to $R^4$ is selected from aryl and $C_{1-10}$alkylaryl.

Polysiloxanes of the present disclosure can be obtained commercially or can be synthesized using any suitable method. For example, some suitable polysiloxanes can be obtained from the Dow Chemical Company of Midland, Michigan.

In some aspects, a polysiloxane is a room temperature vulcanized (RTV) polysiloxane or a slightly elevated temperature vulcanized (LTV) polysiloxane. RTV polysiloxanes and LTV polysiloxanes are typically used as an adhesive to adhere to rubber, plastics, and metal. In some aspects, a polysiloxane of Formula 1 or Formula 1a is used to form an RTV polysiloxane or LTV polysiloxane.

Thermal stability makes compositions having RTV polysiloxanes suitable to bond lenses onto telescopes, coat circuit boards, or secure optics onto satellites or other substrates. Since a satellite, for example, remains in orbit for a long time, it is subjected to large temperature fluctuations (e.g., −101° C. to 288° C.) due to repeated, intermittent exposure to the sun, and polysiloxanes can withstand the conditions.

In some aspects, a polysiloxane is an LTV polysiloxane. For example, polysiloxanes having alkenyl group(s) and/or Si—H bonds can provide advantageous LTV polysiloxanes. Vulcanization may be performed, for example, at about 50° C. to about 80° C.

RTV polysiloxanes and LTV polysiloxanes can be obtained commercially or formed using any suitable polysiloxane, cross-linking agent, and catalyst (e.g., platinum, platinum compounds, or magnesium oxide) (which may be supported on a zeolite support).

Spaceships and satellites operate in high-vacuum environments where outgassing can disrupt electronic systems, optical devices, and thermal radiators. Sealants and encapsulants that release high levels of volatiles can degrade the performance of electronics and sensors. Released gases from materials with high levels of volatiles can also condense on camera lenses. Space-grade polysiloxane (e.g., from Dow Chemical Company) meet NASA requirements for low thermal vacuum outgassing (ASTM E595). The polysiloxanes also provide good physical and electrical stability over a wide temperature range. During a ASTM E595 test, small samples of material are kept under vacuum and heated to 125° C. for a 24-hour period. While the samples are heated, all gasses are channeled through a single release port where a chromium-plated disk is used to collect the volatile materials. After the test, there are two key metrics that are collected and used in certifying a material to NASA Outgassing Standards—Total Mass Loss (% TML) of less than or equal to 1.0% and Collected Volatile Condensable Material % (CVCM %) of less than or equal to 0.1%. TML is a percentage of the original mass a material has lost from the beginning of the 24 hour heating period to the end. CVCM is a percentage of the amount of condensable material collected on the chromium plate of the original mass of the sample.

In some aspects, a polysiloxane can have a thermal stability of about 100° C. or greater, such as about 110° C. or greater, such as about 120° C. or greater, such as from about 120° C. to about 170° C., such as from about 130° C. to about 170° C., such as from about 140° C. to about 160° C., such as from about 150° C. to about 160° C. Thermal stability can be determined by spin coating a polyaniline onto a microscope slide and drying the spin coated sample at 70° C. Silver bars can be painted on the edges of slide for electrical contacts. Samples can be exposed to a temperature (e.g., 150° C.) for 24 hours in a convection oven. Then, the resistance of the sample can be measured to determine thermal stability.

In some aspects, a polysiloxane can have a density of about 1.05 g/cm$^3$ or greater, such as about 1.06 g/cm$^3$ or greater, such as about 1.07 g/cm$^3$ or greater, such as about 1.08 g/cm$^3$ or greater, such as about 1.06 g/cm$^3$ to about 3.5 g/cm$^3$, such as about 1.05 g/cm$^3$ to about 2 g/cm$^3$, such as about 1.1 g/cm$^3$ to about 1.5 g/cm$^3$.

In some aspects, a polysiloxane can have a tensile strength of about 200 psi to about 1,200 psi, such as about 200 psi to about 400 psi, such as about 200 psi to about 300 psi, alternatively about 400 psi to about 1,200 psi, such as about 400 psi to about 1,050 psi, such as about 500 psi to about 1,050 psi, such as about 600 psi to about 1,050 psi, such as about 700 psi to about 1,050 psi, such as about 800 psi to about 1,050 psi.

In some aspects, a polysiloxane can have an elongation of about 100% to about 700%, such as about 150% to about 650%, such as about 150% to about 400%, alternatively about 400% to about 650%.

In some aspects, a polysiloxane can have a Volume Resistivity (Ohm*cm) of about 2 E+3 Ohm*cm or greater, such as about 2 E+3 Ohm*cm to about 1.8 E+15 Ohm*cm, such as about 1 E+10 Ohm*cm to about 1.8 E+15 Ohm*cm, such as about 1 E+13 Ohm*cm to about 1.6 E+15 Ohm*cm.

In some aspects, a polysiloxane is a DOWSIL™ 3145 RTV of Dow Chemical Company. For example, DOWSIL™ 3145 RTV MIL-A-46146 Adhesive Sealant-Clear has the following properties: density of 1.1 g/cm$^3$; elongation of 626%; tensil strength of 864 psi; tensil modulus of 138 psi; Volume Resistivity (Ohm*cm) 4.4 E+14. DOWSIL™ 3145 RTV MIL-A-46146 Adhesive Sealant-Gray has the following properties: density of 1.12 g/cm$^3$; elongation of 670%; tensil strength of 1035 psi; tensil modulus of 150 psi.

In some aspects, a polysiloxane is a DOWSIL™ 3140 RTV of Dow Chemical Company. For example, DOWSIL™ 3140 RTV Coating has the following properties: density of 1.05 g/cm$^3$; elongation of 419%; tensil strength of 434 psi; tensil modulus of 103 psi; Volume Resistivity (Ohm*cm) 2.1 E+14.

In some aspects, a polysiloxane is a DOWSIL™ 3-6265 of Dow Chemical Company. For example, DOWSIL™ 3-6265 Thixotropic Adhesive has the following properties: density of 1.34 g/cm$^3$; elongation of 165%; tensil strength of 700 psi; tensil modulus of 420 psi; Volume Resistivity (Ohm*cm) 4.7 E+14.

In some aspects, a polysiloxane is a DOWSIL™ 6-1104 of Dow Chemical Company. For example, DOWSIL™ 6-1104 has the following properties: density of 1.1 g/cm$^3$; elongation of 600%; tensil strength of 925 psi; Volume Resistivity (Ohm*cm) 1 E+15.

In some aspects, a polysiloxane is a DOWSIL™ 6-1125 of Dow Chemical Company. For example, DOWSIL™ 6-1125 has the following properties: density of 1.1 g/cm$^3$; elongation of 650%; tensil strength of 1025 psi; Volume Resistivity (Ohm*cm) 1 E+15.

In some aspects, a polysiloxane is a DOWSIL™ 93-076 of Dow Chemical Company. For example, DOWSIL™ 93-076 RF Aerospace Sealant has the following properties: density of 1.11 g/cm$^3$ (CTM 0022, ASTM D792); elongation of 400% (CTM 0137A, ASTM D412); tensil strength of 754 psi (CTM 0137A, ASTM D412); Volume Resistivity (Ohm*cm) 1 E+13.

In some aspects, a polysiloxane is a DOWSIL™ 730 of Dow Chemical Company. For example, DOWSIL™ 730 FS Solvent Resistant Sealant has the following properties: density of 1.44 g/cm$^3$ (CTM 0022, ASTM D792); elongation of 195% (CTM 0137A, ASTM D412); tensil strength of 434 psi (CTM 0137A, ASTM D412); Volume Resistivity (Ohm*cm) 5.1 E+13 (CTM 0112, ASTM D150).

In some aspects, a polysiloxane is a DOWSIL™ 732 of Dow Chemical Company. For example, DOWSIL™ 732 Multi-Purpose Sealant has the following properties: elongation of 540% (CTM 0137A, ASTM D412); tensil strength of 334 psi (CTM 0137A, ASTM D412); Volume Resistivity (Ohm*cm) 1.5 E+15 (CTM 0112, ASTM D150).

In some aspects, a polysiloxane is a DOWSIL™ 7092 of Dow Chemical Company. For example, DOWSIL™ 7092 High Green Strength Adhesive and Sealant has the following properties: density of 1.55 g/cm$^3$; elongation of 435% (CTM 0137A, ASTM D412); tensil strength of 290 psi (CTM 0137A, ASTM D412).

In some aspects, a polysiloxane is a DOWSIL™ Q3-1566 of Dow Chemical Company. For example, DOWSIL™ Q3-1566 Heat Resistant Adhesive/Sealant has the following properties: density of 1.06 g/cm$^3$ (CTM 0022, ASTM D792); elongation of 340% (CTM 0137A, ASTM D412); tensil strength of 522 psi (CTM 0137A, ASTM D412).

In some aspects, a polysiloxane is a DOWSIL™ EC-6601 of Dow Chemical Company. For example, DOWSIL™ EC-6601 Electrically Conductive Adhesive has the following properties: density of 3.37 g/cm$^3$; elongation of 194%; tensil strength of 234 psi; Volume Resistivity (Ohm*cm) 2.7 E+3.

As a comparative of a polysiloxane that would not be suitable for aerospace applications, DOWSIL™ 738 Electrical Sealant has the following properties: density of 1.04 g/cm$^3$; tensil strength of 360 psi; elongation 500%; and tensile modulus 70 psi.

Synthesis of Polysiloxanes

Polysiloxanes of the present disclosure can be obtained commercially or can be synthesized using any suitable method. For example, some suitable polysiloxanes can be obtained from the Dow Chemical Company of Midland, Michigan. In some aspects, a polysiloxane is prepared using a ring opening polymerization reaction of various cyclosiloxanes, for example a cationic ring opening polymerization (CROP) reaction. The CROP reaction may be initiated by using a cationic initiator in the presence of a hydrogen terminated siloxane. The CROP reaction and selection of reagents enables a relatively controlled synthesis and polymerization reaction for obtaining the polysiloxanes.

The cationic initiator provides acidolysis and condensation of the cyclosiloxanes, and propagation into various hydrogen terminated polysiloxanes. The hydrogen terminated polysiloxanes, which may also be provided with hydrogen groups along the siloxane chain, can then be replaced or "capped" with various alkyl, aryl and alkylaryl groups. For example, the hydrogen terminated polysiloxanes can be endcapped in the presence of a catalyst with various alkyl, aryl and alkylaryl groups, by reaction with vinyl equivalents of those groups.

The cationic initiator may be selected from acids with a non-nucleophilic base, or protic cationic acids such as $H_2SO_4$, $HClO_4$, and $CF_3SO_3H$ (trifluorosulphonic acid), or Lewis cationic acids such as $AlCl_3$ and $SnCl_4$. In some aspects, the cationic initiator is $CF_3SO_3H$. The catalyst may be a platinum or organoplatinum compound, such as Karstedt's catalyst. In general, protonic acids and Lewis acids, cited here, are sufficiently acidic to react with O on the Si—O—Si oxygen bond to open the ring structure. The platinum catalysts lower the activation energy of this process increasing the rate of reaction.

In one example, there is provided a process for preparing the polysiloxane compounds as described herein comprising the steps of: reacting a cyclosiloxane in the presence of cationic initiator and a hydrogen terminated siloxane to form a hydrogen terminated polysiloxane; and reacting the hydrogen terminated polysiloxane in the presence of a catalyst and vinyl alkyl, aryl or arylalkyl group, to form the polysiloxane compounds.

Polyanlines

In some aspects, polyanilines of the present disclosure are substantially free of byproducts such as un-sulfonated hydrocarbons which provides reduced "outgassing" of the polyanilines as compared to conventional polyanilines. Polyanilines of the present disclosure can have a thermal stability of about 100° C. or greater, a weight average molecular weight (Mw) of from about 50,000 g/mol to about 150,000 g/mol, and/or a molecular weight distribution (MWD) of from about 1 to about 5. Reduced outgassing and improved molecular weight properties of polyanilines of the present disclosure provide improved thermal stability, as compared to conventional polyanilines.

Insufficiently polymerized aniline forming low molecular weight oligomers would occur if the polymerization temperature is not sufficiently controlled or the ratios of reactants are incorrect. These lower molecular weight substances outgas readily from the coating. In addition, if the dopant is not 100% sulfonated, the un-sulfonated hydrocarbon would outgas. By products formed in the synthesis may also pyrolyze at temperatures below 100° C.

Polyanilines can be formed using an aniline and an aryl sulfonic acid, such as an alkyl-substituted aryl sulfonic acid (such as dinonylnaphthylenesulfonic acid (DNNSA)). The aryl sulfonic acid of methods of the present disclosure has 1 wt % or less of un-sulfonated hydrocarbon content. Conventional alkyl-substituted aryl sulfonic acids (such as DNNSA) have greater than 1 wt % of un-sulfonated hydrocarbon content. Un-sulfonated hydrocarbons can include branched and linear paraffins and/or aromatics (such as benzene or naphthalene). It was hypothesized that the un-sulfonated hydrocarbon content of, for example, conventional DNNSA samples was provided by decomposition of the sulfonic acid when placed under ultra-high vacuum for storage. However, it has been discovered that the un-sulfonated hydrocarbons are already present in the DNNSA samples and are likely byproducts of production of conventional DNNSA manufacturing processes. Use of, for example, DNNSA having 1 wt % or less of unsulfonated hydrocarbon content can provide polyanilines having reduced outgassing and improved thermal stability. Polyanilines and articles thereof having reduced outgassing and improved thermal stabiltity can provide compositions, coatings, layers, etc. for use in a wide range of articles, such as aircraft, circuit boards, landcraft, wind turbines, satellites, etc.

Polyanilines of the present disclosure can be an acidified polyaniline (hereinafter referred to as a PANI-Acid or an "emeraldine salt") or a neutral polyaniline. Acidified forms of polyaniline can have conjugate-base counterions (as anionic ligands). Neutral polyanilines can be formed by neutralizing a PANI-Acid under any suitable conditions, such as by treating the PANI-Acid with a sodium hydroxide solution and washing the neutralized polymer product with water.

Molecular weight data herein (Mw, Mn, Mz, Mp, and Mw/Mn) refer to neutral polyaniline (e.g., un-charged; un-doped forms of the polyaniline). In other words, molecular weight of polyanilines herein do not include the molecular weight added by the presence of a dopant, such as an acid, such as DNNSA.

Polyanilines of the present disclosure can have a weight average molecular weight (Mw) of about 50,000 g/mol to about 150,000 g/mol, such as about 75,000 g/mol to about 100,000 g/mol, alternatively about 100,000 g/mol to about 130,000 g/mol. Polyanilines of the present disclosure can have a number average molecular weight (Mn) of about 50,000 g/mol to about 100,000 g/mol, such as about 60,000 g/mol to about 80,000 g/mol, alternatively about 80,000 g/mol to about 100,000 g/mol.

Polyanilines of the present disclosure can have a molecular weight distribution (MWD) of about 1 to about 5, such as about 1 to about 4, such as about 1.2 to about 2.5, such as about 1.3 to about 1.7, as determined by gel permeation chromatography. MWD is determined by dividing Mw by Mn and can be referred to herein as "Mw/Mn".

Polyanilines of the present disclosure can have a z-average molecular weight (Mz) of about 75,000 g/mol to about 250,000 g/mol, such as about 100,000 g/mol to about 250,000 g/mol, such as about 150,000 g/mol to about 250,000 g/mol. Mz is indicative of high molecular content of a polymer. For example, Mz values of polyanilines of the present disclosure can be higher than Mz values of conventional polyanilines, which can provide increased strength (e.g., impact strength) as compared to conventional polyanilines.

Polyanilines of the present disclosure can have a peak average molecular weight (Mp) of about 50,000 g/mol to about 150,000 g/mol, such as about 100,000 g/mol to about 150,000 g/mol, such as about 110,000 g/mol to about 140,000 g/mol. Peak average molecular weight is indicative of the mode of the molecular weight of polymer distribution, highlighting the increased molecular weight of polyanilines of the present disclosure.

Molecular weight properties (such as Mw, Mn, Mz, Mp) of polyanilines can be determined using Gel Permeation Chromatography. The mobile phase can be 0.02 M ammonium formate (AF) in N-methylpyrrolidone (NMP). Calibration can be used to measure molecular weight distributions utilizing viscometric and refractive index detectors. The solutions can be filtered through a 0.45 micron filter prior to use. The polyaniline samples can be precipitated in spectroquality methanol, washed four times with methanol and recovered using vacuum filtration. The samples can be air dried, dissolved in AF-NMP, and passed through a 0.2 micron filter directly into GPC vials for analysis.

A polyaniline of the present disclosure can have a hydrocarbon content of about 1 wt % or less, such as about 0.5 wt % or less, such as about 0.1 wt % or less, such as about 0.001 wt % to about 1 wt %, such as about 0.01 wt % to about 0.5 wt %, based on the total weight of the sample (e.g., film). For example, a film can have a hydrocarbon content of about 1 wt % or less, based on the total weight of the film, e.g., the total weight of hydrocarbon content, polyaniline, and dopant. Hydrocarbons include C1-C20 paraffins and aromatic hydrocarbons such as benzene and naphthalene. In at least one aspect, a hydrocarbon is naphthalene.

A polyaniline (e.g., composition including a polyaniline) of the present disclosure can have an outgassing % of about 0.5% or less, such as about 0.3% or less, such as about 0.1% or less, such as about 0.05% or less, such as about 0.01% or less, according to ASTM E595-93.

Polyanilines of the present disclosure can have a thermal stability of about 100° C. or greater, such as about 110° C. or greater, such as about 120° C. or greater, such as from about 120° C. to about 170° C., such as from about 130° C. to about 170° C., such as from about 140° C. to about 160° C., such as from about 150° C. to about 160° C. Thermal stability can be determined by spin coating a polyaniline onto a microscope slide and drying the spin coated sample at 70° C. Silver bars can be painted on the edges of slide for electrical contacts. Samples can be exposed to a temperature (e.g., 150° C.) for 24 hours in a convection oven. Then, the resistance of the sample can be measured to determine thermal stability.

In at least one aspect, a polyaniline is a PANI-Acid represented by Formula (I):

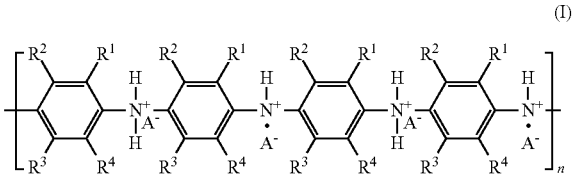

where each instance of $R^1$, $R^2$, $R^3$, and $R^4$ is independently selected from hydrogen, substituted or unsubstituted C1-C20 alkyl, substituted or unsubstituted C1-C20 aryl, substituted or unsubstituted C1-C20 alkaryl, substituted or unsubstituted C1-C20 arlyalkyl, substituted or unsubstituted C1-C20 alkoxyl, and halogen (such as fluoro, chloro, bromo, or iodo), wherein one or more instances of $R^1$, $R^2$, $R^3$, and $R^4$ are optionally substituted with a group independently selected from C1-C20 alkoxyl and halogen (such as fluoro, chloro, bromo, or iodo);

each instance of A is an anionic ligand;

n is an integer such that the weight average molecular weight (Mw) of the polyaniline is from about 55,000 g/mol to about 80,000 g/mol, such as from about 60,000 g/mol to about 75,000 g/mol, such as from about 65,000 g/mol to about 70,000 g/mol.

In at least one aspect, each instance of $R^1$, $R^2$, $R^3$, and $R^4$ is independently selected from hydrogen and unsubstituted C1-C20 alkyl. In one or more aspects, C1-C20 alkyl is selected from methyl, ethyl, propyl, n-butyl, iso-butyl, sec-butyl, n-pentyl, iso-pentyl, sec-pentyl, n-hexyl, iso-hexyl, and sec-hexyl. In at least one aspect, each instance of $R^1$, $R^2$, $R^3$, and $R^4$ is hydrogen.

In at least one aspect, C1-C20 aryl is selected from phenyl and naphthyl. In at least one aspect, C1-C20 alkaryl is benzyl. In at least one aspect, C1-C20 arlyalkyl is toluyl, mesityl, or ethylbenzyl.

In at least one aspect, each instance of A is an anionic ligand independently selected from a sulfonate, a hydroxide, and a halogen (such as fluoro, chloro, bromo, or iodo). In one or more aspects, A is a sulfonate such as a dinonylnaphthalene sulfonate.

Aryl Sulfonic Acids, Anilines, and Methods for Preparing Polyanilines

A representative non-limiting reaction scheme for forming polyanilines of the present disclosure is shown below in Scheme 1. As shown in Scheme 1, an aniline is treated with an alkyl-substituted aryl sulfonic acid and a catalyst to form a polyaniline represented by Formula (I).

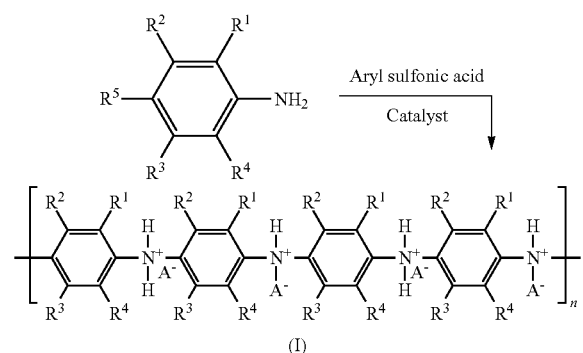

Scheme 1

$R^1$, $R^2$, $R^3$, $R^4$, n, and A of Formula (I) of Scheme 1 are as described for Formula (I) above.

For the aniline monomer of Scheme 1, each instance of $R^1$, $R^2$, $R^3$, and $R^4$ is independently selected from hydrogen, substituted or unsubstituted C1-C20 alkyl, substituted or unsubstituted C1-C20 aryl, substituted or unsubstituted C1-C20 alkaryl, substituted or unsubstituted C1-C20 arlyalkyl, substituted or unsubstituted C1-C20 alkoxyl, and halogen (such as fluoro, chloro, bromo, or iodo), wherein one or more instances of $R^1$, $R^2$, $R^3$, and $R^4$ are optionally substituted with a group independently selected from C1-C20 alkoxyl and halogen (such as fluoro, chloro, bromo, or iodo); and $R^5$ is hydrogen.

In at least one aspect, each instance of $R^1$, $R^2$, $R^3$, and $R^4$ of the aniline monomer of Scheme 1 is independently selected from hydrogen and unsubstituted C1-C20 alkyl. In one or more aspects, C1-C20 alkyl is selected from methyl, ethyl, propyl, n-butyl, iso-butyl, sec-butyl, n-pentyl, iso-pentyl, sec-pentyl, n-hexyl, iso-hexyl, and sec-hexyl. In at least one aspect, each instance of $R^1$, $R^2$, $R^3$, and $R^4$ is hydrogen.

Aryl sulfonic acids (or solutions thereof, e.g. organic solutions) of the present disclosure can have 1 wt % or less of unsulfonated hydrocarbon content and can be an aryl sulfonic acid, such as DNNSA. Aryl sulfonic acids, such as DNNSA, having 1 wt % or less of unsulfonated hydrocarbon content may be obtained commercially from, for example, King Industries.

In at least one aspect, an aryl sulfonic acid (such as DNNSA) (or solution thereof) has a hydrocarbon content of about 1 wt % or less, such as about 0.5 wt % or less, such as about 0.1 wt % or less, such as from about 0.001 wt % to about 1 wt %, such as from about 0.01 wt % to about 0.5 wt %, based on the total weight of the acid (the acid absent additional solvent, e.g. isopropanol).

A molar ratio of aryl sulfonic acid:aniline in methods of the present disclosure can be from about 0.2:1 to about 2:1, such as from about 0.3:1 to about 1:1, such as from about 0.8:1 to about 1:0.8, such as about 1:1. Such molar ratios (aryl sulfonic acid: aniline) ensure that the polyaniline is at least partially protonated. Protonation promotes electrical conductivity.

Catalysts of the present disclosure can include any suitable ammonium or sulfate catalyst, such as ammonium persulfate.

Furthermore, addition of additional hydrocarbon solvent might not be preferred. Addition of high levels of, for example, heptane or hexane prevents the emulsion from forming. For example, if a method is performed with only DNNSA in heptane and no 2-butoxyethanol, the reaction might not proceed to yield a soluble product.

Methods can include using aryl sulfonic acid to form polyanlines of the present disclosure (also referred to hereinafter as PANI-Acid) as a solvent-soluble polymer by flow reactor chemical processing. Flow reactor systems and methods provide unique processing sequences for direct collection of the purified emeraldine salt without post reactor manipulation. Flow reactor systems and methods provide improvement over other methods of synthesizing conductive polymers, and in particular conductive polymer salts, for example, PANI-Acid using very short reaction times not otherwise obtainable using conventional methods, which involve long reaction times.

By way of example, the present systems and methods provide improvement in the efficient and controlled synthesis of polyaniline (PANI) salt as a soluble, intrinsically conductive polymer. A continuous flow synthesis of PANI-Acid or an "emeraldine salt" is herein described using a flow reactor. In some examples the flow reactor comprises a microfluidic (1 to about 750 um I.D.) tube reactor. In some examples, the microfluidic tube comprises a fluoropolymer, e.g., TEFLON®. The tube reactor provides a suitable surface for deposition of the forming polymer and a straight-forward purification of the conductive polymer salt.

As used herein, the phrase "flow reactor" is inclusive of a micro-flow reactor. A micro-flow reactor is used herein as a flow reactor having flow dimensions, e.g., tubing inner diameter (I. D.), less than 1 mm (1000 microns).

In some aspects, as the polymerization reaction proceeds, the majority of the polymer product deposits on the walls of the tubing. The polymeric product can be purified by washing with water to remove aqueous soluble reactants, reagents, and side products.

The conductive polymer salts formed in the flow reactor and deposited on the walls of the tubing can be eluted with organic solvent to provide soluble conductive polymer salt. The flow reactor can be configurable for in-situ characterization e.g., by UV-Vis spectroscopy, infrared, and/or mass spectroscopy.

An apparatus and related methods for polymerizing at least one reactant are described. In certain examples, the apparatus is a microfluidic apparatus comprising a mixing chamber and microchannel. In addition, the reactor can further comprise an output chamber and a detection unit that is operatively connected to the microchannel.

Any suitable apparatus (e.g., flow reactor) can be used to form polyanilines of the present disclosure, such as those described in U.S. Pat. No. 10,118,992, which is incorporated by reference herein for purposes of U.S. law.

Aryl Sulfonic Acids

A sulfonic acid of the present disclosure is used to form A-moiety (as a sulfonate) of a polyaniline described above. A sulfonic acid may decrease resistivity of a composition of the present disclosure. Sulfonic acids may include phenyl sulfonic acids, naphthyl sulfonic acids, camphor sulfonic acids, anthracenyl sulfonic acids, pyrenyl sulfonic acids, each of which is unsubstituted, monosubstituted or multi-plysubstituted, where each instance of substitution is independently alkyl (e.g., C1-C20 alkyl), aryl, amino, nitro, or halo (—F, —Cl, —Br, —I).

In some aspects, a naphthylsulfonic acid is represented by Formula (I):

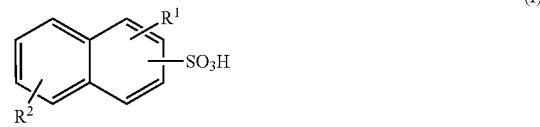

(I)

Each benzene ring of Formula (I) is unsubstituted, monosubstituted, disubstituted, trisubstituted, or tetrasubstituted with $R^1$ or $R^2$, as appropriate. Each instance of $R^1$ is independently selected from alkyl (e.g., C1-C20 alkyl), aryl, amino, nitro, and halo (—F, —Cl, —Br, —I), and each instance of $R^2$ is independently selected from alkyl (e.g., C1-C20 alkyl), aryl, amino, nitro, and halo (—F, —Cl, —Br, —I). C1-C20 alkyl substituted naphthylsulfonic acid may be dinonylnaphthylsulfonic acid, methylnaphthylsulfonic acid, ethylnaphthylsulfonic acid, propylnaphthylsulfonic acid, butylnaphthylsulfonic acid, pentylnaphthylsulfonic acid, hexylnaphthylsulfonic acid, heptylnaphthylsulfonic acid, octylnaphthylsulfonic acid, nonylnaphthylsulfonic acid, decylnaphthylsulfonic acid, dimethylnaphthylsulfonic acid, diethylnaphthylsulfonic acid, dipropylnaphthylsulfonic acid, dibutylnaphthylsulfonic acid, dipentylnaphthylsulfonic acid, dihexylnaphthylsulfonic acid, diheptylnaphthylsulfonic acid, dioctylnaphthylsulfonic acid, didecylnaphthylsulfonic acid, or isomers thereof.

| Chemical Name | Non-limiting Example Chemical Structures |
|---|---|
| dinonylnaphthylsulfonic acid | ![structure 1] |
| | ![structure 2] |
| | ![structure 3] |

-continued
| Chemical Name | Non-limiting Example Chemical Structures |
|---|---|
| | 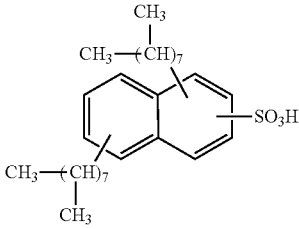 |
| methylnaphthylsulfonic acid | 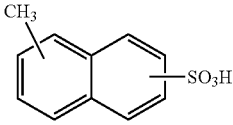 |
| | 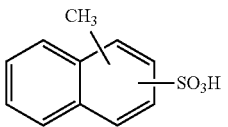 |
| ethylnaphthylsulfonic acid | 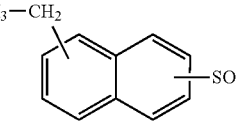 |
| | 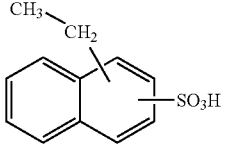 |
| propylnaphthylsulfonic acid | 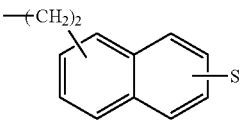 |
| | 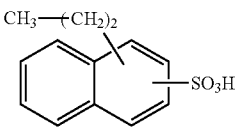 |
| | 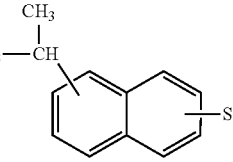 |
| | 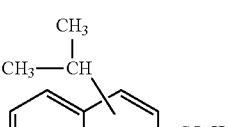 |
| butylnaphthylsulfonic acid | 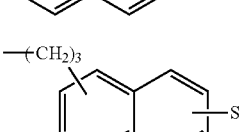 |

| Chemical Name | Non-limiting Example Chemical Structures |
|---|---|
| | CH$_3$—(CH$_2$)$_3$-naphthyl-SO$_3$H |
| | (CH$_3$)$_2$CH-(CH$_2$)$_2$-naphthyl-SO$_3$H |
| | (CH$_3$)$_2$CH-(CH$_2$)$_2$-naphthyl-SO$_3$H |
| pentylnaphthylsulfonic acid | CH$_3$—(CH$_2$)$_4$-naphthyl-SO$_3$H |
| | CH$_3$—(CH$_2$)$_4$-naphthyl-SO$_3$H |
| | (CH$_3$)$_2$CH-(CH$_2$)$_3$-naphthyl-SO$_3$H |
| | (CH$_3$)$_2$CH-(CH$_2$)$_3$-naphthyl-SO$_3$H |
| hexylnaphthylsulfonic acid | CH$_3$—(CH$_2$)$_5$-naphthyl-SO$_3$H |
| | CH$_3$—(CH$_2$)$_5$-naphthyl-SO$_3$H |
| | (CH$_3$)$_2$CH-(CH$_2$)$_4$-naphthyl-SO$_3$H |

-continued

| Chemical Name | Non-limiting Example Chemical Structures |
|---|---|
| | (CH₃)₂CH-(CH)₄-naphthyl-SO₃H |
| heptylnaphthylsulfonic acid | CH₃-(CH₂)₆-naphthyl-SO₃H |
| | CH₃-(CH₂)₆-naphthyl-SO₃H |
| | (CH₃)₂CH-(CH)₅-naphthyl-SO₃H |
| | (CH₃)₂CH-(CH)₅-naphthyl-SO₃H |
| octylnaphthylsulfonic acid | CH₃-(CH₂)₇-naphthyl-SO₃H |
| | CH₃-(CH₂)₇-naphthyl-SO₃H |
| | (CH₃)₂CH-(CH)₆-naphthyl-SO₃H |
| | (CH₃)₂CH-(CH)₆-naphthyl-SO₃H |
| nonylnaphthylsulfonic acid | CH₃-(CH₂)₈-naphthyl-SO₃H |

-continued

| Chemical Name | Non-limiting Example Chemical Structures |
|---|---|
| | CH$_3$—(CH$_2$)$_8$—naphthyl—SO$_3$H |
| | (CH$_3$)$_2$CH—(CH)$_7$—naphthyl—SO$_3$H (with CH$_3$ branch) |
| | (CH$_3$)$_2$CH—(CH)$_7$—naphthyl—SO$_3$H (with CH$_3$ branch) |
| decylnaphthylsulfonic acid | CH$_3$—(CH$_2$)$_9$—naphthyl—SO$_3$H |
| | CH$_3$—(CH$_2$)$_9$—naphthyl—SO$_3$H |
| | (CH$_3$)$_2$CH—(CH)$_8$—naphthyl—SO$_3$H (with CH$_3$ branch) |
| | (CH$_3$)$_2$CH—(CH)$_8$—naphthyl—SO$_3$H (with CH$_3$ branch) |
| dimethylnaphthylsulfonic acid | CH$_3$, CH$_3$ on naphthyl—SO$_3$H |
| | CH$_3$, CH$_3$ on naphthyl—SO$_3$H |
| diethylnaphthylsulfonic acid | CH$_3$—CH$_2$, CH$_3$—CH$_2$ on naphthyl—SO$_3$H |

-continued

| Chemical Name | Non-limiting Example Chemical Structures |
|---|---|
| | diethylnaphthylsulfonic acid structure (CH₃—CH₂ substituents, —SO₃H) |
| dipropylnaphthylsulfonic acid | structures with CH₃—(CH₂)₂ substituents and —SO₃H; also isopropyl (CH₃—CH(CH₃)—) variants |
| dibutylnaphthylsulfonic acid | structures with CH₃—(CH₂)₃ substituents and —SO₃H; also sec-butyl (CH₃—CH(CH₃)—CH₂—) variants |

| Chemical Name | Non-limiting Example Chemical Structures |
|---|---|
| | 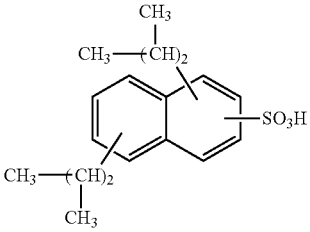 |
| dipentylnaphthylsulfonic acid | 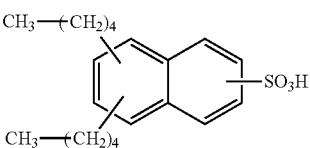 |
| | 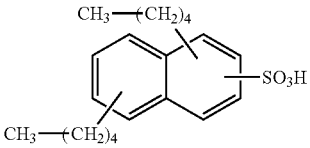 |
| | 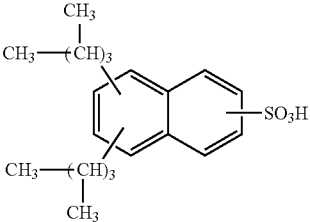 |
| | 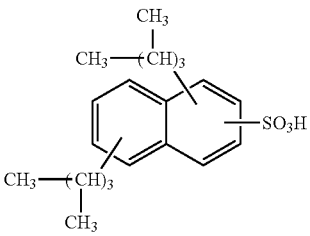 |
| dihexylnaphthylsulfonic acid | 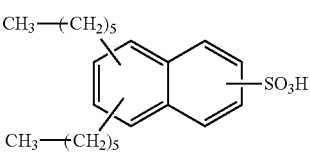 |
| | 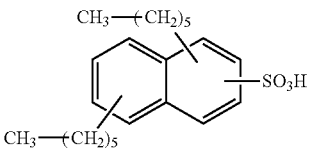 |
| | 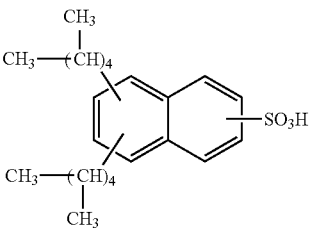 |

-continued
| Chemical Name | Non-limiting Example Chemical Structures |
|---|---|
| | 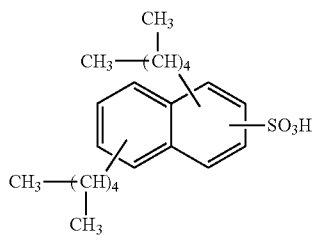 |
| diheptylnaphthylsulfonic acid | 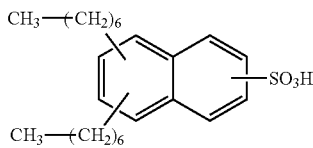 |
| | 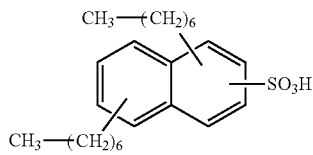 |
| | 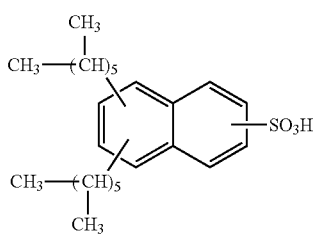 |
| | 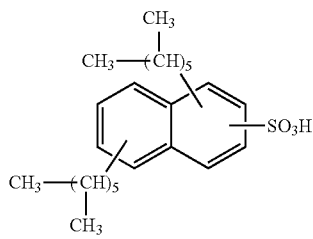 |
| dioctylnaphthylsulfonic acid | 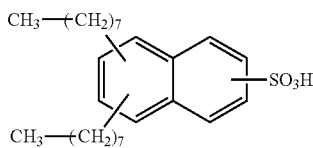 |
| | 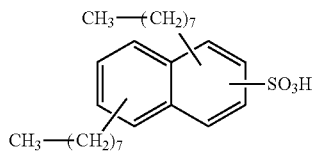 |

-continued

| Chemical Name | Non-limiting Example Chemical Structures |
|---|---|
|  | naphthalene-SO₃H with three CH₃—(CH)₆—CH₃ branched substituents |
|  | naphthalene-SO₃H with three CH₃—(CH)₆—CH₃ branched substituents (alternate isomer) |
| didecylnaphthylsulfonic acid | naphthalene-SO₃H with two CH₃—(CH₂)₉ linear substituents |
|  | naphthalene-SO₃H with two CH₃—(CH₂)₉ linear substituents (alternate isomer) |
|  | naphthalene-SO₃H with three CH₃—(CH)₈—CH₃ branched substituents |
|  | naphthalene-SO₃H with three CH₃—(CH)₈—CH₃ branched substituents (alternate isomer) |

Methods of Forming Compositions

In at least one aspect, a method for forming a composition includes introducing (e.g., mixing) a polyaniline and a polysiloxane to form a composition. Methods can include disposing (e.g., depositing) the composition onto a substrate. Methods can include curing the composition in a stagewise manner. For example, the composition may be allowed to cure at ambient temperature or elevated temperature for a first period of time, followed by increasing the temperature to a second temperature for a second period of time. In some aspects, the composition is cured at a first temperature of about 20° C. to about 50° C., such as about 30° C. to about 40° C. for about 1 hour to about 48 hours. In some aspects, the composition is cured at a second temperature of about 50° C. to about 200° C., such as about 100° C. to about 175° C., such as about 130° C. to about 155° C. for about 1 hour to about 48 hours.

The first temperature can provide controlled (e.g., slow) evaporation of solvent from the composition, and the second temperature can provide further evaporation of solvent from the composition. The controlled removal of solvent from the composition provides a composition (e.g., as a layer) having reduced or eliminated blistering (as compared to a layer formed without stagewise curing), which likewise improves electrical and thermal stability properties of the composition. The stagewise curing can also provide reduced or eliminated outgassing (e.g., of residual solvent) when a cured composition of the present disclosure is used as a coating on, for example, a satellite, because solvent is slowly and controllably removed during curing and the solvent is not trapped within the cured composition during end use.

It has also been discovered that mixing additional polysiloxane with a composition (e.g., already including a polysiloxane and a polyaniline) tends to form a gel/precipitate, which prevents a composition from being substantially homogeneous. If gelation occurs, it is very difficult to use the formulation in a coating process such as brush applying, dip coating, spraying or printing.

Methods may include dissolving the polyaniline in a solvent before mixing the polyaniline with the polysiloxane. Similarly, methods may include dissolving the polysiloxane in a solvent before mixing the polyaniline with the polysiloxane. The solvent can be an aromatic hydrocarbon solvent. The solvent can be a xylene, a benzene, a toluene, or combination(s) thereof. It has been discovered that an aromatic hydrocarbon solvent can provide a substantially homogeneous composition of the present disclosure (even after deposition and stagewise curing). In some aspects, a solvent is an aliphatic hydrocarbon solvent. The solvent can be cyclopentane, cyclohexane, cycloheptane, or combination(s) thereof. The substantially homogeneous composition can have a % solids of about 95 wt % to about 100 wt %, such as about 99 wt % to about 99.9 wt %, such as about 100 wt %.

Compositions of the present disclosure can be deposited onto a substrate, such as a surface of a vehicle component, by any suitable deposition method, such as dipping, spraying, brush coating, spin coating, roll coating, doctor-blade coating, or mixtures thereof. Compositions of the present disclosure can be deposited onto one or more surfaces of a vehicle component, such as an inner surface (e.g., inner cavity), an outer surface, or both, of an aircraft component.

Depositing the composition onto the substrate may be performed by spin-coating the composition onto a surface of a substrate, such as a vehicle component, at a rate of between about 100 rpm and about 4,000 rpm, such as between about 500 rpm and about 2,000 rpm, for example about 500 rpm, about 1,000 rpm, about 1,500 rpm, about 2,000 rpm.

Alternatively, depositing the composition onto the substrate is achieved by spraying the composition onto a surface of a substrate, such as a vehicle component using any suitable composition spray apparatus.

Methods may include rinsing the composition with a rinsing agent once the composition has been deposited and cured. The rinsing agent can include isopropyl alcohol, p-Toluenesulfonic acid, acetone, methanol, hydrates thereof, solvates thereof, or combinations thereof. Rinsing may include spraying the rinsing agent onto a surface of the composition for about 1 second to about 10 minutes, such as about 1 minute to about 5 minutes. Rinsing may include spraying the rinsing agent onto a surface of a composition of an amount of about 1 mL to about 25 kL, such as about 1 L to about 100 L, such as about 1 L to about 5 L. Rinsing may include rinsing the composition with a second rinsing agent that is isopropyl alcohol, p-Toluenesulfonic acid, acetone, methanol, hydrates thereof, solvates thereof, or combinations thereof. In at least one aspect, the rinsing agent is p-Toluene sulfonic acid and is a mixture of 1 wt % p-Toluenesulfonic acid in butoxyethanol. The rinsing agent may be a mixture of dinonylnaphthyl sulfonic acid and isopropylalcohol. In at least one aspect, rinsing includes dipping the composition into the rinsing agent for about 1 second to about 1 minute.

Molecular Weight Determinations of Polyaniline. Molecular weight distribution averages may be determined by size exclusion chromatography (SEC). Chromatograms may be obtained with SEC systems, such as a model 150-CV SEC/viscometry (SEC/VISC) system (Waters Chromatography Inc.) and a multicomponent SEC system (Waters Chromatography Inc.) assembled from a model 590 pump, a model 712 autoinjector, a model 410 differential refractive index detector, and a model TCH column heater. Both SEC systems may be operated at 45° C. and employ a bank of two styragel SEC columns (Waters Chromatography Inc.) with mean permeabilities of 105 and 103 Å. UV-grade N-methylpyrolidone (NMP) (Burdick & Jackson Co.) modified with 0.02 M $NH_4HCO_2$ (Fluka Chemical Co.) may be used as the mobile phase and polymer solvent. A flow rate setting of 0.5 mL/min may be employed.

Calibration of the SEC may be performed with monodisperse polystyrene standards (Toya Soda Inc.) ranging in molecular weight from $1.1 \times 10^6$ to 2698. Intrinsic viscosities of the polystyrene calibrants may be measured using the SEC/viscometric detector. These values provide the Mark-Houwink expression for polystyrene in NMP/0.02 M $NH_4HCO_2$ at 45° C. for calibrating the size-exclusion chromatograph according to universal calibration:

$$[\eta](dL/g) = (1.947 \times 10^{-4})M^{0.66}$$

A linear least-squares fitting may be used to generate a universal calibration curve or a polystyrene-based molecular weight calibration curve.

Mark-Houwink constants for polyaniline may be determined from the set molecular weight distribution averages and intrinsic viscosities calculated for individual data points of SEC/VISC chromatograms. Data acquisition and reduction may be provided by TRISEC software (Viscotek Corp.). Reported molecular weight distribution averages may be means of two determinations.

The SEC/VISC chromatograms for deprotonated polyaniline salts are typically unimodal, and nearly baseline resolution of the PANI and its sulfonic acid component is observed. The sulfonic acid components separate from the polyaniline peak and are not included in the molecular weight calculations. In at least one aspect, the polyaniline salts produce broad size-exclusion chromatograms, with Mw/Mn (polydispersity) >1.5. A Mark-Houwink (M-H) plot for PANI-DNNSA (1:2) is linear with R=0.671 and log K=−3.146.

Resistance. Resistance measurements may be made using any suitable set of electrodes and measurement apparatus, such as a Keithley 4200 SCS. Preferably, resistance measurements are made using the van der Pauw method. The four-point method uses parallel source and sense measurements of current and voltage, respectively, across a sample surface. Current and voltage polarities are switched across each junction to test for ambipolarity. Sample geometry should be held constant and allows for the direct comparison of samples. In order to account for differences in the charge directionality, the current and voltage measurements are rotated across each possible arrangement, as shown in Table 1.

TABLE 1

Possible electrode arrangements for resistance measurements

| R | Source I | Sense V |
|---|---|---|
| $R_A$ | 1-2 | 3-4 |
| $R_B$ | 2-3 | 4-1 |
| $R_C$ | 3-4 | 1-2 |
| $R_D$ | 4-1 | 3-2 |

Van der Pauw resistance measurements are performed by forcing a current across two adjacent electrodes and sensing the voltage drop across the sample in a parallel arrangement of electrodes.

The sheet resistance may be calculated from the ratio of V to I from the measured composition. In the case of a sample showing truly isotropic resistance, $R_A=R_B=R_C=R_D$. In the case of isotropic resistances, e.g., where $R_A=R_B$, the sheet resistance is determined by the average of the two measured resistances, as shown in Equation 1 below. For samples with anisotropic resistances (the x-direction and y-direction demonstrate different resistances), calculating the sheet resistance becomes more complicated, which will be addressed in the following paragraph. For all samples where $R_A \neq R_C$ and $R_B \neq R_D$, the measurement is void. Equation 2 shows how the bulk resistivity, ρ, is determined if the composition thickness, d, is known (typically resistivity is reported in Ω·cm, thus comprises the use of d in cm), which is derived from the original Van der Pauw theorem. Bulk resistivity, ρ, can then be used to calculate conductivity, σ(S·cm−1), which is inversely proportional (Equation 2).

$$R_S = \frac{R_A + R_B}{2} \quad \text{Eqn. 1}$$

$$\rho = \frac{\ln(2)d}{\pi R_S} = \frac{1}{\sigma} \quad \text{Eqn. 2}$$

For cases where $R_A \neq R_B$, extracting conductivity values from the Van der Pauw equation becomes more difficult. In the case where the conductivity is not isotropic, the conductivity becomes a tensor value with x, y, and z dimensions. In the case of very thin compositions, an accurate conductivity value may be obtained by taking the square root of the product of the perpendicular conductivity measurement values, as shown in Equation 3 below. This calculation is only true if the directions being measured align with the tensor axes of the conductivity. It is assumed that the larger of the two resistances measured by the technique is exactly along the lowest conductivity tensor, and the lower of the resistance measurements is exactly along the highest conductivity tensor. If there were a misalignment of the conductivity tensor with the electrode/sample orientation, an inaccurate conductivity value would be measured.

$$\sigma = \sqrt{\sigma_A \cdot \sigma_B} \quad \text{Eqn. 3}$$

Figure 2:
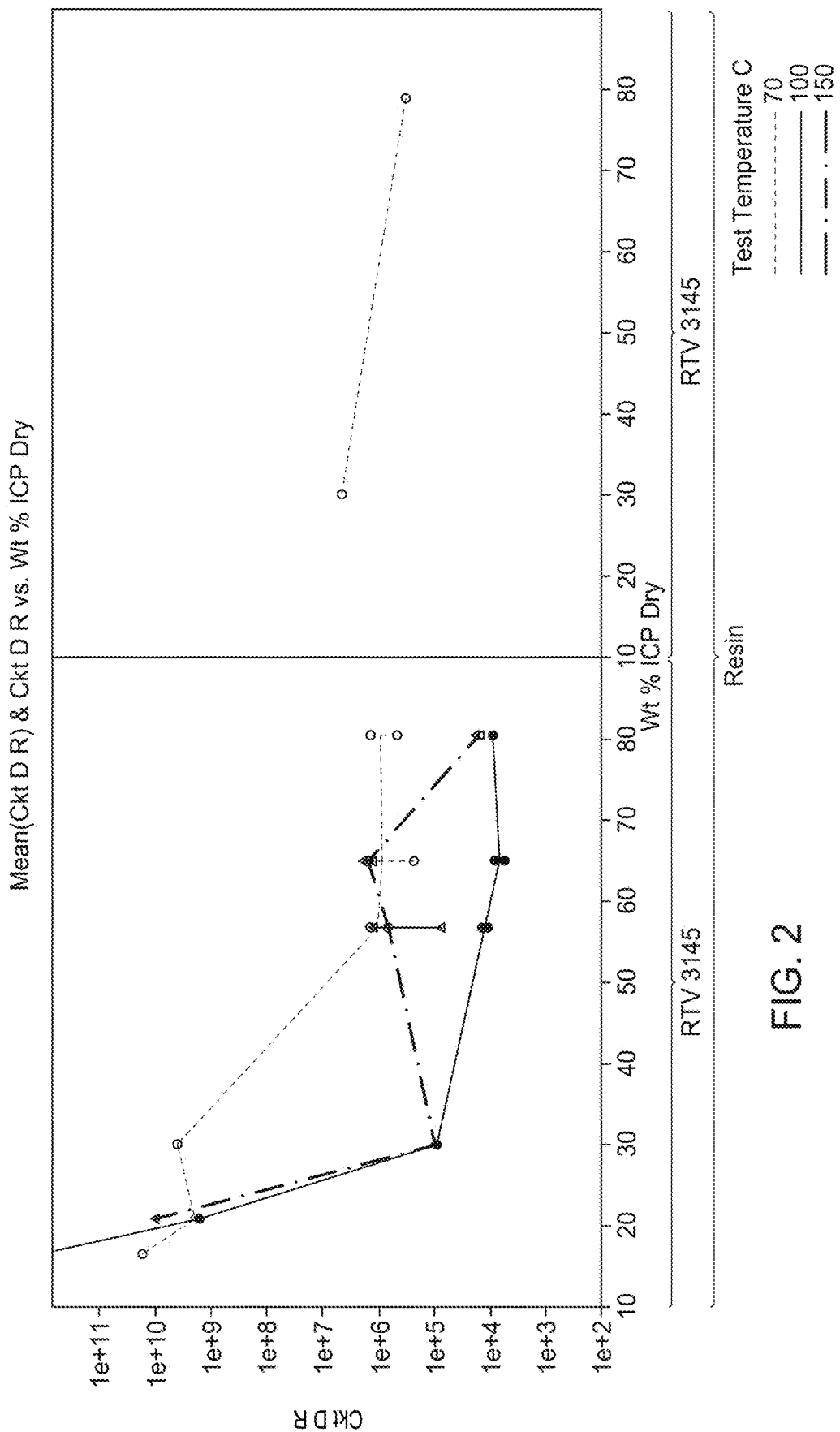
FIG. 2 is a graph illustrating a comparison of RTV 3140 and RTV 3145: circuit D (24 hour cure) resistances as a function of temperatures and % PANI-DNNSA in the dry film, according to an aspect.

For the Van der Pauw measurement chip of FIG. 2, the numbers correspond to axis of the measurement while the sigmaX notations ($\sigma_A$, $\sigma_B$, and $\sigma_C$) represent the conductivity tensor directions. A mismatch of sample axis and tensor axis, as in the sample on the right, leads to inaccurately measured conductivities. The Van der Pauw printed electrodes with the Keithley 4200 SCS provide a suitable device test bed for the measurement of samples.

In an effort to control the measurement humidity effects, a small sample probe station may be used to exclusively connect to the Keithley 4200 SCS for accurate Van der Pauw measurements on the Dropsens prefabricated electrodes.

Electrochemical Impedance Spectroscopy (EIS). EIS uses a variable frequency alternating current source to probe the changes to a sample's impedance at different frequencies. Impedance, similar to a resistor, is the lag between an applied alternating current and the measured voltage change. Electrical circuit components respond in frequency dependent ways, which can be used to identify specific properties of a coating being measured. True ohmic resistors respond identically to direct current (DC) and alternating current (AC) sources, and thus show no frequency-dependent resistive response. Capacitors (as well as more complex electrical components) have a frequency-dependent response; at low frequencies the impedance is very high but at high frequencies the electrical impedance is lower. In the analysis of EIS data, a predicted model, known as the equivalence circuit model, is made composed of real and approximated electrical components to closely approximate the sample system. The model's calculated impedance spectra are then compared to the measured spectra.

The impedance response of the composition and its combined response as a capacitor and resistor may be determined. For goodness of fit, the fits may be obtained using the Gamry built in spectral fitting software. The Gamry program uses a χ2 fitting equation, Eqn. 4.

$$\chi 2 = \sum \left[ (Zmeas_{real} - Zfit_{real})^2 + (Zmeas_{imag} - Zfit_{imag})^2 \right] \quad \text{Eqn. 4}$$

A perfectly matched predicted and measured impedance spectrum will result in χ2=0. In at least one aspect, a value of $\chi 2 < 10^{-4}$ is an acceptable "good fit". In at least one aspect, when comparing two different equivalent circuit models, a difference of less than one third of the value is deemed indistinguishable.

Rinse to Reduce Resistance

Compositions of the present disclosure may be rinsed, for example, after deposition onto a surface and before or after curing, with one or more rinsing agents. Rinsing agents comprise isopropyl alcohol (IPA), p-Toluenesulfonic acid, acetone, methanol, salts thereof, and mixtures thereof. In at least one aspect, a composition is coated onto a substrate and dipped into a solution containing one or more rinsing agents. In at least one aspect, a rinse comprises spraying a rinsing agent on a surface of a composition deposited on a substrate. In at least one aspect, a rinsing agent is sprayed onto a surface of a composition for between about 1 second and about 10 minutes, such as between about 30 seconds and about 2 minutes. In at least one aspect, a rinsing agent is sprayed onto a surface of a composition in an amount of between about 1 mL and about 25 KL, such as between about 100 L and about 1 kL. A composition having a higher resistance may be suitable for an application and, therefore, rinsing with a rinsing agent may be excluded. For example, resistance of an unrinsed coating(s) may be sufficient for a particular use, and the unrinsed coating(s) may still be cured.

An IPA rinse, for example, removes some of the excess acid, such as DNNSA. Acid removal promotes increased contact between polymer chains of the composition and reduced resistance of the composition. Rinse with a rinsing agent further promotes solubility of the composition in a variety of solvents. The increased solubility facilitates deposition of the composition onto a substrate because less solvent may be used for deposition as compared to unrinsed compositions. A reduced amount of solvent for deposition provides faster curing times and reduced costs of production.

EIS can be used to help quantify the effects of rinsing with a rinsing agent on PANI composition impedance.

Multilayer Stacks

Aspects of the present disclosure comprise compositions deposited onto a substrate as multiple layers to form a multilayer stack. In at least one aspect, a multilayer stack provides a lower overall electrical resistance as compared to a single layer of the same composition and thickness. A multilayer stack may also provide increased strength of the overall coating/surface of, for example, a vehicle component due to the additive effect of strength provided by the layers individually.

A multilayer stack comprises one or more polymer layers, one or more layers (e.g., each layer) independently formed from a composition of the present disclosure.

A multilayer stack may also provide one or more conductive layers for use as a heating layer, e.g. deicing applications. In at least one aspect, a multilayer stack comprises an outer protective layer disposed over an electrically conductive layer. As used herein, the term "outer" layer may include a layer having no additional layer deposited onto the outer layer, the outer layer being the layer directly exposed to the environment.

Composition Applications

Non-limiting examples for uses of compositions of the present disclosure include uses as a thermoplastic and/or as a component of prepreg material. For prepreg material, compositions of the present disclosure may be applied onto and/or impregnated into fiber materials composed of graphite, fiberglass, nylon, Kevlar® and related materials (for example, other aramid polymers), polyethylenes, among others.

Compositions of the present disclosure may be deposited onto a surface of a substrate, such as a vehicle component. Vehicle components include a circuit board or a structural component such as a panel or joint of an aircraft, automobile, etc. A vehicle component comprises a nose, a fuel tank, a tail cone, a panel, a coated lap joint between two or more panels, a wing-to-fuselage assembly, structural aircraft composite, fuselage body-joint, wing rib-to-skin joint, and/or other internal component.

Compositions may be deposited onto a surface of a substrate by any suitable deposition method. Deposition methods include, but are not limited to, dipping, spraying, brush coating, spin coating, roll coating, doctor-blade coating, and mixtures thereof. Compositions of the present disclosure may be deposited onto a substrate, such as a surface of a vehicle component, at a range of thicknesses, such as about 0.1 µm to about 20 mm, such as about 1 µm to about 10 µm, such as about 1 µm to about 8 µm, such as about 2 µm to about 6 µm. Composition thickness is utilized to tune conductivity and resistance of a deposited composition.

After a composition is deposited onto a substrate, the composition may be cured at any suitable temperature, e.g. to evaporate solvent. Curing may be performed using any suitable curing apparatus.

Deicing: After depositing one or more compositions of the present disclosure onto a component, such as a vehicle component, (and optional curing), the component may be "deiced" if, for example, harsh weather conditions have resulted in accumulation of ice on one or more components. Because compositions of the present disclosure are conductive, application of a voltage to a surface containing the composition will result in increased temperature of the surface and melt a portion of the ice accumulated on the surface. In at least one aspect, a voltage is applied to a surface containing one or more compositions of the present disclosure that provides complete melting of ice accumulation on the surface. In at least one aspect, a voltage is applied to a surface containing one or more compositions of the present disclosure that provides partial melting of ice accumulation on the surface such that the partially melted ice accumulation slides off of the vehicle component.

In at least one aspect, deicing comprises contacting any suitable AC/DC voltage generator with a surface containing one or more compositions of the present disclosure, and providing an AC voltage to the one or more compositions. Contacting an AC voltage generator with a surface containing one or more compositions (as a resistor) of the present disclosure provides resistive heating of at least the surface and may provide resistive heating of one or more layers of a vehicle component. In at least one aspect, deicing comprises providing voltage to a surface containing one or more compositions of the present disclosure by electrically generating components of an aircraft. For example, an aircraft engine is switched to the active mode and the AC power provided by an aircraft engine transmits to a surface of the aircraft which deices one or more surfaces of components of the aircraft. These aspects provide intrinsic deicing of an aircraft without a need to apply an external voltage generator to an aircraft component surface.

In at least one aspect, a method of heating a vehicle component includes applying a voltage to a surface of a composition disposed on a vehicle component. The composition includes a polyaniline and a polysiloxane. Applying the voltage to the surface of the composition at least partially melts solid water (ice) disposed on a surface of the vehicle component. The voltage can be an alternating current (AC) voltage of between about 10 Hertz and about 2000 Hertz, such as between about 500 Hertz and about 1,000 Hertz, for example 500 Hertz, 600 Hertz, 700 Hertz, 800 Hertz, 900 Hertz. The voltage can be an alternating current (AC) voltage of between about 10 volts and about 2000 volts, such as between about 100 volts and about 500 volts, for example 100 volts, 200 volts, 300 volts, 400 volts, 500 volts. Methods can include adjusting the AC voltage with one or more transformers. Methods can include adjusting the AC voltage into DC voltage with one or more rectifiers. Methods can include adjusting the DC voltage into AC voltage with one or more oscillators.

Radome and other electrostatic dissipation: In an aircraft, a radar is present behind the nose of the aircraft. The nose often times builds up a form of static electricity known as precipitation static (P-static), which causes electrostatic interference with the radar in addition to brush discharge events causing damage to a coating on the outer surface of the aircraft. Electrostatic interference with the radar results in communication interference between the aircraft and the control tower on the ground as well as interference with detection of other aircraft in the sky. P-static further causes electrostatic interference with other components of an aircraft, for example, components that contain antenna(s). Furthermore, static charge often builds inside of a fuel tank of an aircraft which may affect fuel tank function.

If the aircraft is a fighter jet, for example, the canopy of the fighter jet often builds static charge, which causes static interference of radar(s) and antenna(s).

After disposing one or more compositions of the present disclosure onto a vehicle component (and optional curing), the one or more compositions can electrostatically dissipate static electricity such as P-static accumulated at a location on the aircraft, such as a nose of the aircraft. The electrostatic dissipation of static electricity provides reduced or eliminated electrostatic interference with a radar of the aircraft and reduced or eliminated brush discharge events resulting in reduced or eliminated damage to a coating on an outer surface of an aircraft. Compositions of the present disclosure further provide reduced or eliminated electrostatic interference with other components of an aircraft, such as components that contain antenna(s). If compositions of the present disclosure are coated inside of a fuel tank, the one or more compositions provide reduced or eliminated static charge buildup inside the fuel tank.

Additional Aspects

The present disclosure provides, among others, the following aspects, each of which may be considered as optionally including any alternate aspects.

Clause 1. A composition, comprising:
a polyaniline;
a polysiloxane having a density of about 1.05 g/cm$^3$ or greater; and optionally a solvent.

Clause 2. The composition of Clauses 1, wherein the composition comprises:
about 5 wt % to about 30 wt % polyaniline;
about 5 wt % to about 40 wt % polysiloxane; and
a remainder balance comprising the solvent.

Clause 3. The composition of Clauses 1 or 2, wherein the solvent is an aromatic hydrocarbon solvent.

Clause 4. The composition of any of Clauses 1 to 3, wherein the aromatic hydrocarbon solvent is toluene.

Clause 5. The composition of any of Clauses 1 to 4, wherein the composition comprises:
about 5 wt % to about 30 wt % polyaniline;
about 70 wt % to about 95 wt % polysiloxane.

Clause 6. The composition of any of Clauses 1 to 5, wherein the composition has a resistivity of about 4 E+5Ω/□ to about 2.5 E+11Ω/□.

Clause 7. The composition of any of Clauses 1 to 6, wherein the composition has a resistivity of about 4 E+5Ω/□ to about to about 3 E+8Ω/□.

Clause 8. The composition of any of Clauses 1 to 7, wherein the polysiloxane has a thermal stability of about 150° C. to about 160° C. for at least 24 hours.

Clause 9. The composition of any of Clauses 1 to 8, wherein the polysiloxane has a tensile strength of about 500 psi to about 1,050 psi.

Clause 10. The composition of any of Clauses 1 to 9, wherein the polysiloxane has a density of about 1.1 g/cm$^3$ to about 1.5 g/cm$^3$.

Clause 11. The composition of any of Clauses 1 to 10, wherein the polysiloxane has an elongation of about 150% to about 650%.

Clause 12. The composition of any of Clauses 1 to 11, wherein the polyaniline has a thermal stability of about 150° C. to about 160° C. for at least 24 hours.

Clause 13. The composition of any of Clauses 1 to 12, wherein the polyaniline has:
a weight average molecular weight (Mw) of about 50,000 g/mol to about 150,000 g/mol, and
a molecular weight distribution (MWD) of about 1 to about 5.

Clause 14. The composition of any of Clauses 1 to 13, wherein the polyaniline has an Mw of about 100,000 g/mol to about 130,000 g/mol.

Clause 15. The composition of any of Clauses 1 to 14, wherein the polyaniline has an outgassing % of about 0.1% or less, according to ASTM E595-93.

Clause 16. The composition of any of Clauses 1 to 15, wherein the polyaniline comprises a phenyl sulfonate, naphthyl sulfonate, camphor sulfonate, anthracenyl sulfonate, pyrenyl sulfonate, or combination(s) thereof.

Clause 17. A circuit board comprising the composition of any of Clauses 1 to 16 disposed thereon.

Clause 18. A satellite comprising the circuit board of any of Clauses 1 to 17.

Clause 19. A method, comprising:
introducing a polyaniline with a polysiloxane having a density of about 1.05 g/cm$^3$ or greater to form a composition.

Clause 20. The method of Clause 19, wherein introducing comprises introducing a first mixture comprising the polyaniline and a first aromatic hydrocarbon solvent with a second mixture comprising the polysiloxane and a second aromatic hydrocarbon solvent that is the same or different than the first aromatic hydrocarbon solvent.

Clause 21. The method of Clauses 19 or 20, wherein the aromatic hydrocarbon solvent is toluene.

Clause 22. A method, comprising:
disposing a composition onto a substrate, the composition comprising a polyaniline and a polysiloxane having a density of about 1.05 g/cm$^3$ or greater.

Clause 23. The method of Clause 22, further comprising:
curing the composition at a first temperature of about 20° C. to about 50° C. for about 1 hour to about 48 hours; and
curing the composition at a second temperature of about 50° C. to about 200° C. for about 1 hour to about 48 hours.

Clause 24. The method of Clauses 22 or 23, further comprising rinsing the composition with a rinsing agent.

Clause 25. The method of any of Clauses 22 to 24, wherein the substrate is a circuit board.

EXAMPLES

Experiment 1

DOWSIL™ RTV 3145 was dissolved in toluene, and PANI-DNNSA in toluene was added, followed by shear mixing (with a Thinky mixer). The films were drop cast onto the substrates. Spin coating did not work well. The vials were capped tightly to ensure dryness. The compositions were then air dried on the bench for an hour or two, followed by drying in a convection oven at 66° C. overnight. FIG. 1 is a graph illustrating resistance versus PANI-DNNSA concentration of the compositions (with DOWSIL™ RTV 3145 as polysiloxane).

Experiment 2

Starting materials: Polyaniline-dinonlynaphthalene (PANI-DNNSA) in toluene (50% w/w) from Boron Molecular Dowsil RTV 3140 or 3145 (Room Temperature Curing Silicone Rubber from DOW Chemical); Toluene solvent; Custom Printed Wiring Boards.

Procedure: Formulation: Mixed 5 to 30 grams of PANI-DNNSA into 1 to 25 grams of RTV to give desired weight % of PANI-DNNSA in final cured film (1 to 90% w/w). Add 10 to 100 ml of toluene to the above and mix using the Thinky Planetary Mixer. Once mixing is complete, any additional RTV was not added to the formulation since it will cause the formulation to gel (samples 17.2 to 17.6 in Table 1). In addition, care should be taken to ensure minimum exposure to the atmosphere since the formulations will cure when exposed to atmospheric moisture.

Coating and Curing: Wiring boards were coated by "drop casting" directly onto the board using an eyedropper. The coating is them allowed to air dry followed by drying at 70° C., 100° C., and 150° C. at various times in a convection oven. All resistance measurements were performed using a Keithley 4200-SCS at +/−10V bias.

Results: Table 1 summarizes the compositions of the RTV formulations evaluated, cure temperatures cure times and electrical resistances of coatings. Note that each sample cured sequentially for 24 hours at 70° C., 100° C., and 150° C.

Resistances were measured at room temperature after each thermal exposure. Results are shown in Table 1.

Figure 5:
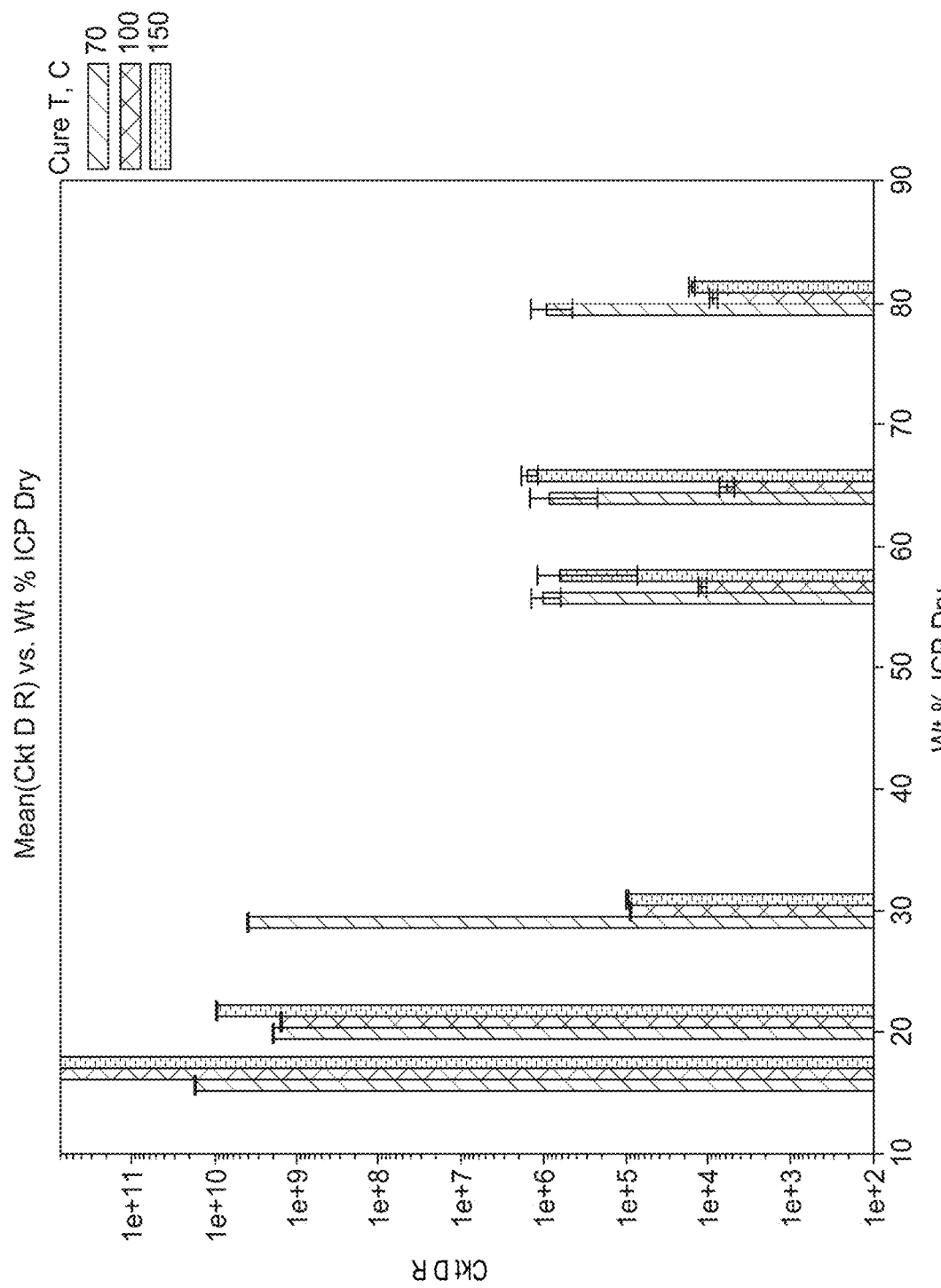
FIG. 5. is a bar graph illustrating DOW RTV 3145 PANI formulations Ckt D resistances (cure time=24 hours) as a function of temperature and % PANI-DNNSA in the dry film, according to an aspect.

FIG. 5. is a Bar Graph of DOW RTV 3145 PANI formulations Ckt D resistances (cure time=24 hours) as a function of temperature and % PANI-DNNSA in the dry film.

Figure 6B:
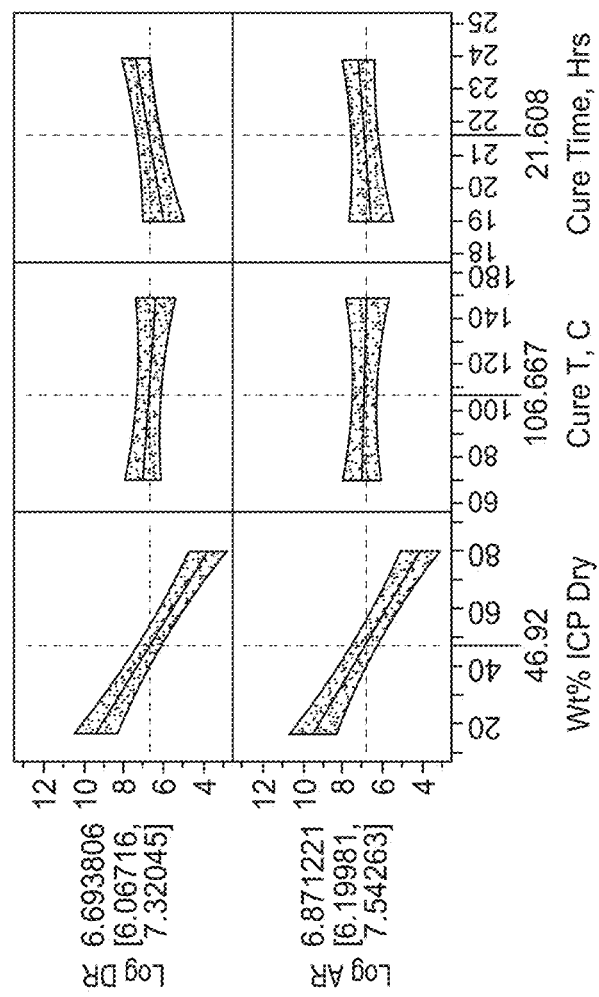
FIG. 6B is a graph illustrating JMP prediction profile, according to an aspect.
Figure 6A:
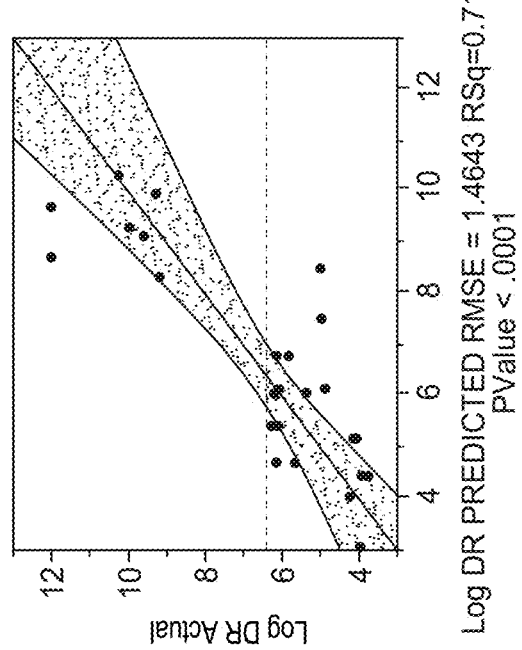
FIG. 6A is a graph illustrating non-linear least squares fit of data, according to an aspect.

FIG. 6A is a graph illustrating Non-linear least squares fit of data and FIG. 6B is a graph illustrating JMP prediction profile. (See jmp/en_us/statistics-knowledge-portal/what-is-regression/the-method-of-leastsquares for details)

Electrically conductive RTVs have been successfully formulated with PANI-DNNSA. Interestingly, at concentrations of PANI less than 30%, the resistance jumps by several orders of magnitude. As shown in FIG. 6, Wt % ICP Dry and Cure T, C can be variables that influence electrical resistance. Comparison with polyurethane formulations: At 30% PANI in RTV, there is basically no change in resistance between curing at 100° C. and 150° C. A similar test with a polyurethane containing 5% PANI on CKT D showed a resistance increase from 1.76 E+8 to 5.85 E+10, over 2

TABLE 1

| Example | Wt. ICP Soln | Wt. Resin | Wt. Toluene | Wt % ICP Dry | Cure T, C | Cure Time, Hrs | Ckt D R | Ckt A R |
|---|---|---|---|---|---|---|---|---|
| 20-1-2 | 19.59 | 2.38 | 25.21 | 80.45175 | 70 | 24 | 4.53E+05 | 2.10E+05 |
| 20-1-3 | 19.59 | 2.38 | 25.21 | 80.45175 | 70 | 24 | 1.40E+06 | 4.58E+05 |
| 20-2-1 | 18.8 | 5.06 | 25.84 | 65.00692 | 70 | 24 | 2.27E+05 | 5.24E+05 |
| 20-2-2 | 18.8 | 5.06 | 25.84 | 65.00692 | 70 | 24 | 1.50E+06 | 6.80E+04 |
| 20-3-1 | 21.6 | 8.22 | 24.73 | 56.78233 | 70 | 24 | 6.63E+05 | 6.11E+05 |
| 20-3-2 | 21.6 | 8.22 | 24.73 | 56.78233 | 70 | 24 | 1.40E+06 | 3.20E+05 |
| 20-5-1 | 9.57 | 11.115 | 37.5 | 30.09434 | 70 | 24 | 4.00E+09 | 3.91E+08 |
| 20-5-2 | 8.29 | 15.677 | 43.53 | 20.91111 | 70 | 24 | 1.90E+09 | 7.70E+09 |
| 20-5-3 | 8.92 | 22.35 | 45.84 | 16.63558 | 70 | 24 | 1.70E+10 | 1.40E+10 |
| 20-1-2 | 19.59 | 2.38 | 25.21 | 80.45175 | 100 | 19 | 9.00E+03 | 2.20E+04 |
| 20-1-3 | 19.59 | 2.38 | 25.21 | 80.45175 | 100 | 19 | 9.00E+03 | 2.60E+04 |
| 20-2-1 | 18.8 | 5.06 | 25.84 | 65.00692 | 100 | 19 | 8.00E+03 | 1.50E+04 |
| 20-2-2 | 18.8 | 5.06 | 25.84 | 65.00692 | 100 | 19 | 5.60E+03 | 3.29E+04 |
| 20-3-1 | 21.6 | 8.22 | 24.73 | 56.78233 | 100 | 19 | 1.33E+04 | 1.98E+04 |
| 20-3-2 | 21.6 | 8.22 | 24.73 | 56.78233 | 100 | 19 | 1.07E+04 | 4.79E+04 |
| 20-5-1 | 9.57 | 11.115 | 37.5 | 30.09434 | 100 | 19 | 9.10E+04 | 3.25E+05 |
| 20-5-2 | 8.29 | 15.677 | 43.53 | 20.91111 | 100 | 19 | 1.55E+09 | 6.70E+10 |
| 20-5-3 | 8.92 | 22.35 | 45.84 | 16.63558 | 100 | 19 | 1.00E+12 | 1.00E+12 |
| 20-1-2 | 19.59 | 2.38 | 25.21 | 80.45175 | 150 | 24 | 1.44E+04 | 8.85E+05 |
| 20-1-3 | 19.59 | 2.38 | 25.21 | 80.45175 | 150 | 24 | 1.70E+04 | 4.30E+04 |
| 20-2-1 | 18.8 | 5.06 | 25.84 | 65.00692 | 150 | 24 | 1.90E+06 | 2.94E+05 |
| 20-2-2 | 18.8 | 5.06 | 25.84 | 65.00692 | 150 | 24 | 1.20E+06 | 9.10E+06 |
| 20-3-1 | 21.6 | 8.22 | 24.73 | 56.78233 | 150 | 24 | 7.25E+04 | 8.40E+03 |
| 20-3-2 | 21.6 | 8.22 | 24.73 | 56.78233 | 150 | 24 | 1.20E+06 | 4.60E+06 |
| 20-5-1 | 9.57 | 11.115 | 37.5 | 30.09434 | 150 | 24 | 9.82E+04 | 1.31E+05 |
| 20-5-2 | 8.29 | 15.677 | 43.53 | 20.91111 | 150 | 24 | 9.40E+09 | 2.93E+08 |
| 16-1 | 17.376 | 2.328 | 26.641 | 78.8671 | 70 | 24 | 3.21E+05 | 3.69E+04 |
| 17-1 | 19.008 | 22.067 | 32.296 | 30.10358 | 70 | 24 | 4.60E+06 | 3.50E+06 |
| 17-2 | 19.008 | 32.3 | 32.3 | 22.73467 | 70 | 24 | 6.93E+10 | 5.29E+10 |
| 17-3* | 19.008 | 51.2 | 32.3 | 15.6563 | 70 | 24 | 7.37E+10 | 4.43E+10 |
| 17-4* | 19.008 | 82.9 | 32.3 | 10.28527 | 70 | 24 | | |
| 17-5* | 19.008 | 82.9 | 58.5 | 10.28527 | 70 | 24 | 1.17E+11 | 1.99E+10 |
| 17-6* | 19.008 | 82.9 | 85.5 | 10.28527 | 70 | 24 | | |

*= Coating gels when additional RTV added.

FIG. 2 is a graph illustrating a comparison of RTV 3140 and RTV 3145: circuit D (24 hour cure) resistances as a function of temperatures and % PANI-DNNSA in the dry film. Note the jump in resistance below 30% PANI-DNNSA.

Figure 3:
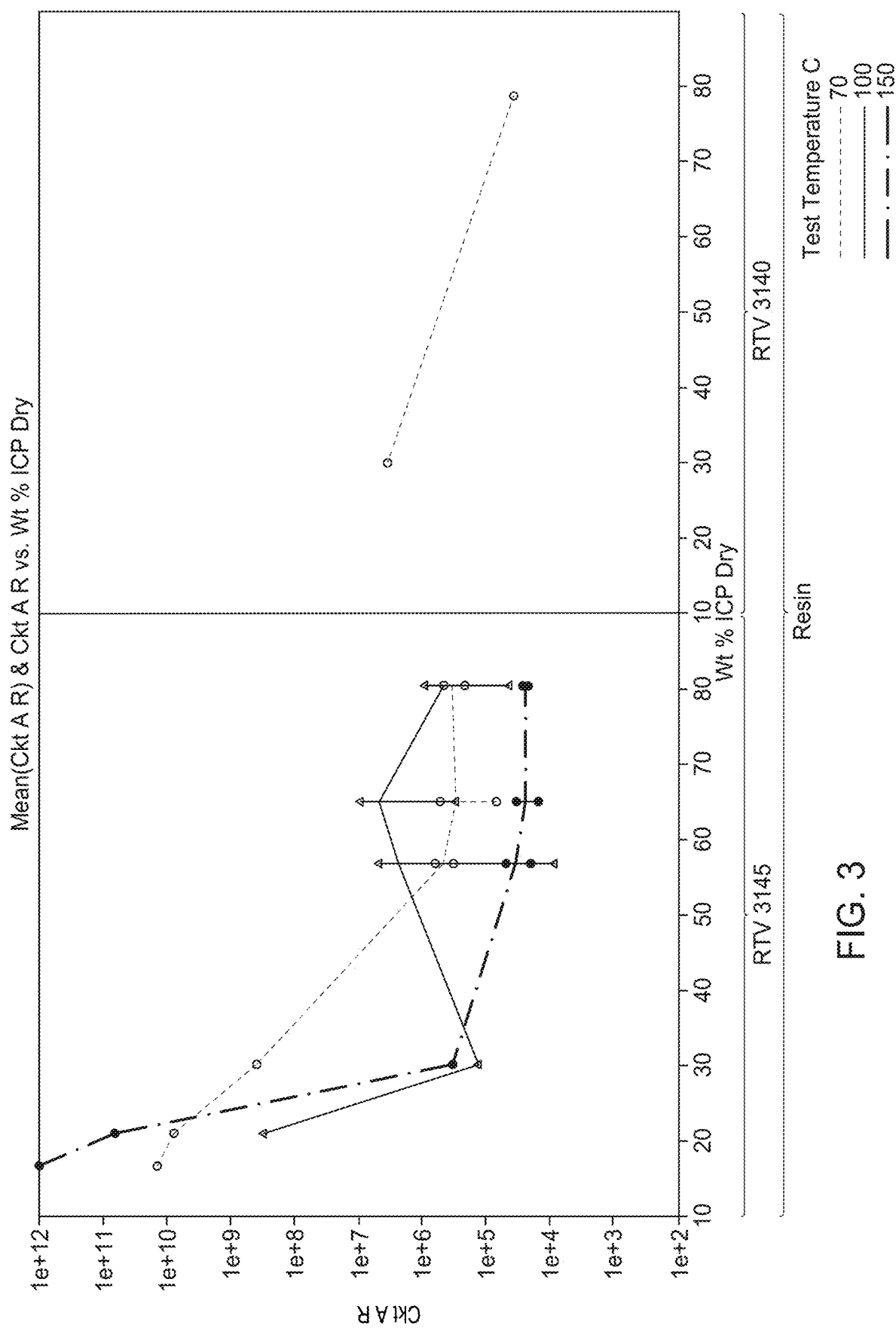
FIG. 3 is a graph illustrating a comparison of RTV 3140 and RTV 3145: circuit A (24 hour cure) resistances as a function of temperatures and % PANI-DNNSA in the dry film, according to an aspect.

FIG. 3 is a graph illustrating a comparison of RTV 3140 and RTV 3145: circuit A (24 hour cure) resistances as a function of temperatures and % PANI-DNNSA in the dry film.

Figure 4:
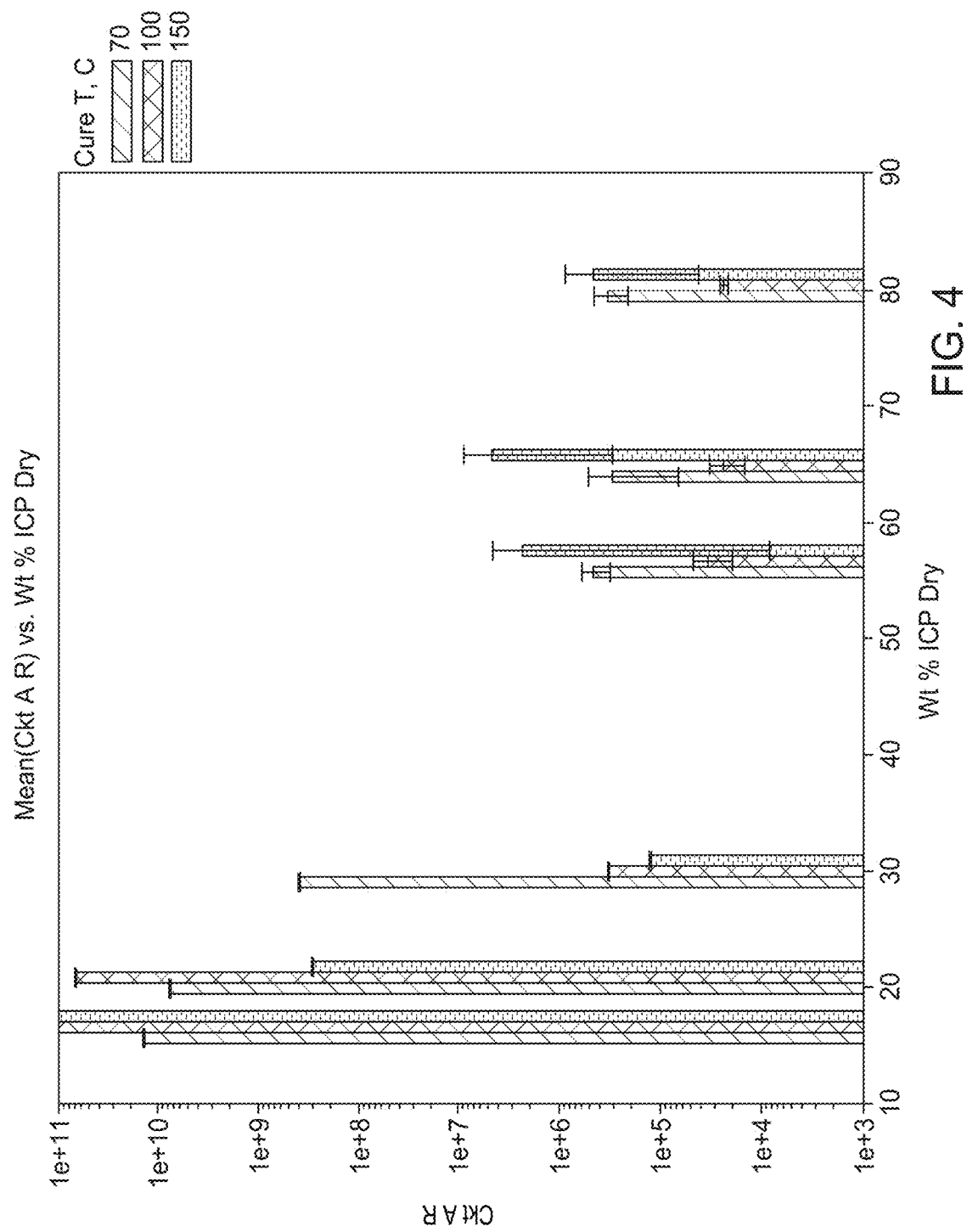
FIG. 4 is a bar graph illustrating DOW RTV 3145 PANI formulations Circuit A resistances (cure time=24 hours) as a function of temperature and % PANI-DNNSA in the dry film, according to an aspect.

FIG. 4 is a Bar Graph of DOW RTV 3145 PANI formulations Circuit A resistances (cure time=24 hours) as a function of temperature and % PANI-DNNSA in the dry film.

orders of magnitude. It should be noted this was a 5% PANI formulation in polyurethane, and that 5% PANI in the RTV formulation does not conduct electricity so these two should not be directly compared.

Overall, compositions of the present disclosure can be conductive and have robust high temperature properties. For example, a polysiloxane may provide improved thermal stability, and methods for forming compositions of the present disclosure can provide a substantially homogeneous composition which can provide conductivity and robust thermal stability of a composition. For example, use of a solvent compatible with both polysiloxane and polyaniline and stagewise curing of the composition can provide a substantially homogeneous composition. Compositions having polyaniline as a minority component (e.g., 30 wt % or less) can have substantially improved electrical properties (as compared to compositions having polyaniline as a major component). Compositions of the present disclosure can be used for any suitable end use application. For example, a composition can be included as a coating for a circuit board (e.g., of a satellite) or as a conductive sealant.

"Aryl" whether used alone, or as part of an alkylaryl, may refer to: (i) a substituted or unsubstituted mono- or polycyclic aromatic carbocyclic moiety, e.g., of about 6 to about 20 carbon atoms, such as phenyl, naphthyl or fluorenyl; or (ii) a substituted or unsubstituted partially saturated polycyclic carbocyclic aromatic ring system in which an aryl and a cycloalkyl or cycloalkenyl group are fused together to form a cyclic structure such as a tetrahydronaphthyl, indenyl, indanyl or fluorene ring. It will be appreciated that the polycyclic ring system may include a bicyclic and/or tricyclic ring system. It will also be appreciated that the term "unsubstituted" refers to the absence of one or more substituent groups or presence of one or more hydrogens. The "substituted" groups may be C1-10alkyl as defined herein, such as straight chain or branched C1-4alkyl.

"Alkyl" whether used alone, or as part of an alkylaryl, represents straight or branched chain hydrocarbons ranging in size from one to about 20 carbon atoms, or more. Thus alkyl moieties include, unless explicitly limited to smaller groups, moieties ranging in size, for example, from one to about 6 carbon atoms or greater, such as, methyl, ethyl, n-propyl, iso-propyl and/or butyl, pentyl, hexyl, and higher isomers, including, e.g., those straight or branched chain hydrocarbons ranging in size from about 6 to about 20 carbon atoms, or greater. The term "C1-20alkyl," as used herein refers to a straight chain or branched, saturated hydrocarbon having from 1 to 20 carbon atoms. Representative "C1-20alkyl" groups include, but are not limited to, methyl, ethyl, n-propyl, n-butyl, n-pentyl, n-hexyl, n-heptyl, n-octyl, n-nonyl, n-decyl; n-undecyl, n-dodecyl, n-tridecyl, n-tetradecyl, n-pentadecyl, n-hexadecyl, n-heptadecyl, n-octadecyl, n-nonadecyl, n-icosyl. The term "C1-10alkyl," as used herein refers to a straight chain or branched, saturated hydrocarbon having from 1 to 10 carbon atoms. Representative "C1-10alkyl" groups include, but are not limited to, methyl, ethyl, n-propyl, n-butyl, n-pentyl, n-hexyl, n-heptyl, n-octyl, n-nonyl and n-decyl; while branched C1-8alkyls, for example, include, but are not limited to, isopropyl, sec-butyl, isobutyl, tert-butyl, isopentyl, 2-methylbutyl, 1-hexyl, 2-hexyl, 3-hexyl, methyl, ethyl, propyl, isopropyl, n-butyl, isobutyl, sec-butyl, tert-butyl, n-pentyl, isopentyl, neopentyl, n-hexyl, isohexyl, 2-methylpentyl, 3-methylpentyl, 2,2-dimethylbutyl, 2,3-dimethylbutyl, 2,2-dimethylpentyl, 2,3-dimethylpentyl, 3,3-dimethylpentyl, 2,3,4-trimethylpentyl, 3-methylhexyl, 2,2-dimethylhexyl, 2,4-dimethylhexyl, 2,5-dimethylhexyl, 3,5-dimethylhexyl, 2,4-dimethylpentyl, 2-methylheptyl, 3-methylheptyl, n-heptyl, isoheptyl, n-octyl, and isooctyl.

The term "alkylaryl", "C1-20alkylaryl", or "C1-10alkylaryl", refers to a compound having an alkyl group bonded to an aryl group wherein the "alkyl", "C1-20alkyl", "C1-10alkyl", and "aryl" moieties, are each defined supra.

As used herein, the term "composition" includes the component(s) of the composition and/or reaction product(s) of two or more components of the composition. Compositions may be in the form of a layer, e.g., the composition may be disposed onto a substrate, such as a surface of a vehicle component.

The descriptions of the various aspects of the present disclosure have been presented for purposes of illustration, but are not intended to be exhaustive or limited to the aspects disclosed. Many modifications and variations will be apparent to those of ordinary skill in the art without departing from the scope of the described aspects. The terminology used herein was chosen to, for example, best explain the principles of the aspects, the practical application or technical improvement over technologies found in the marketplace, or to enable others of ordinary skill in the art to understand the aspects disclosed herein.

While the foregoing is directed to aspects of the present disclosure, other and further aspects of the present disclosure may be devised without departing from the basic scope thereof. Furthermore, while the foregoing is directed to polymers, compositions, and methods as applied to the aerospace industry, aspects of the present disclosure may be directed to other applications not associated with an aircraft, such as applications in the automotive industry, marine industry, energy industry, wind turbines, and the like.

What is claimed is:

1. A circuit board comprising a composition layer disposed thereon, the composition layer comprising a cured product prepared from a composition comprising:
    about 5 wt % to about 30 wt % of a polyaniline comprising a weight average molecular weight (Mw) of about 100,000 g/mol to about 130,000 g/mol; and
    a polysiloxane having a density of about 1.05 g/cm$^3$ or greater as measured by ASTM D792;
    wherein the composition layer has a thickness of about 1 μm to about 20 mm and a resistivity of about 4 E+5Ω/□ to about 2.5 E+11Ω/□.

2. The circuit board of claim 1, wherein the composition comprises about 70 wt % to about 95 wt % polysiloxane, wherein an amount of polyaniline+polysiloxane does not exceed 100 wt %.

3. The circuit board of claim 1, wherein the composition layer has a resistivity of about 4 E+5Ω/□ to about 3 E+8Ω/□.

4. The circuit board of claim 1, wherein the polysiloxane has a thermal stability of about 150° C. to about 160° C. for at least 24 hours.

5. The circuit board of claim 1, wherein the polysiloxane has a density of about 1.1 g/cm$^3$ to about 1.5 g/cm$^3$ as measured by ASTM D792.

6. The circuit board of claim 1, wherein the polyaniline has a thermal stability of about 150° C. to about 160° C. for at least 24 hours.

7. The circuit board of claim 1, wherein the polyaniline has a molecular weight distribution (MWD) of about 1 to about 5.

8. The circuit board of claim 1, wherein the polyaniline has an outgassing % of about 0.1% or less, according to ASTM E595-93.

9. The circuit board of claim 1, wherein the composition layer has a resistivity of about 4 E+5Ω/□ to about 3 E+6Ω/□.

10. The circuit board of claim 9, wherein the composition layer is cured at curing temperatures of about 130° C. to about 155° C.

11. The circuit board of claim 1, wherein the polysiloxane has an elongation of about 100% to about 700%.

12. The circuit board of claim 1, wherein the polysiloxane has a tensile modulus of about 70 psi to about 420 psi.

13. The circuit board of claim 1, wherein the composition layer has a thickness of about 1 μm to about 10 μm.

14. The circuit board of claim 13, wherein the polyaniline has a molecular weight distribution (MWD) of about 1.3 to about 1.7.

15. A method, comprising:
introducing a first mixture comprising about 5 wt % to about 30 wt % of a polyaniline comprising a weight average molecular weight (Mw) of about 100,000 g/mol to about 130,000 g/mol in a first aromatic hydrocarbon solvent with a second mixture comprising a polysiloxane and a second aromatic hydrocarbon solvent, wherein the second mixture comprises a density of about 1.05 g/cm$^3$ or greater as measured by ASTM D792 to form a composition,
disposing the composition onto a substrate to form a composition layer, and
curing the composition layer at a temperature of about 100° C. to about 175° C. to produce a cured composition layer having a thickness of about 1 μm to about 20 mm and a resistivity of about 4 E+5Ω/□ to about 2.5 E+11Ω/□.

16. The method of claim 15, wherein the second aromatic hydrocarbon solvent is the same or different than the first aromatic hydrocarbon solvent.

17. A method, comprising:
disposing a composition onto a substrate to form a composition layer, the composition layer comprising a polyaniline comprising a weight average molecular weight (Mw) of about 100,000 g/mol to about 130,000 g/mol and a polysiloxane having a density of about 1.05 g/cm$^3$ or greater, and
curing the composition layer to form a cured composition layer at a curing temperatures between about 20° C. to about 200° C.,
wherein the cured composition layer has a thickness of about 1 μm to about 20 mm and a resistivity of about 4 E+5Ω/□ to about 2.5 E+11Ω/□.

18. The method of claim 17, wherein curing the composition further comprises:
curing the composition layer at a first temperature of about 20° C. to about 50° C. for about 1 hour to about 48 hours; and
curing the composition layer at a second temperature of about 50° C. to about 200° C. for about 1 hour to about 48 hours, wherein the first temperature is different than the second temperature.

19. The method of claim 18, wherein the second temperature is about 100° C. to about 175° C.

20. The method of claim 17, further comprising rinsing the cured composition layer with a rinsing agent.

* * * * *